США005741630A

United States Patent [19]

Marshall et al.

[11] Patent Number: 5,741,630
[45] Date of Patent: Apr. 21, 1998

[54] PROCESS FOR FIXING AN IMAGE, AND MEDIUM FOR USE THEREIN

[75] Inventors: John L. Marshall, Somerville; Rita S. Shon Baker, Brookline; Larry C. Takiff; Stephen J. Telfer, both of Arlington; John C. Warner, Norwood, all of Mass.

[73] Assignee: Polaroid Corporation, Cambridge, Mass.

[21] Appl. No.: 232,757

[22] Filed: Apr. 25, 1994

[51] Int. Cl.$^6$ .................................................. G03C 1/73
[52] U.S. Cl. ........................... 430/337; 430/338; 430/332; 430/336; 430/335
[58] Field of Search .................................. 430/337, 338, 430/332, 336, 335

[56] References Cited

U.S. PATENT DOCUMENTS

| | | | |
|---|---|---|---|
| 3,617,270 | 11/1971 | Kampfer | 430/62 |
| 3,623,866 | 11/1971 | Averbach | 96/48 |
| 3,915,706 | 10/1975 | Limburg et al. | 96/27 R |
| 3,932,514 | 1/1976 | Thelen et al. | 260/586 P |
| 4,092,146 | 5/1978 | Fischer et al. | 71/70 |
| 4,159,387 | 6/1979 | Bellus | 560/185 |
| 4,251,619 | 2/1981 | Kurita | 430/292 |
| 4,306,014 | 12/1981 | Kunikane et al. | 430/338 |
| 4,345,017 | 8/1982 | Cournoyer et al. | 430/221 |
| 4,508,811 | 4/1985 | Gravesteijn et al. | 430/270 |
| 4,602,263 | 7/1986 | Borrer et al. | 346/201 |
| 4,659,649 | 4/1987 | Dickinson et al. | 430/280 |
| 4,701,402 | 10/1987 | Patel et al. | 430/332 |
| 4,720,449 | 1/1988 | Borrer et al. | 430/338 |
| 4,826,976 | 5/1989 | Borrer et al. | 544/58.4 |
| 4,857,437 | 8/1989 | Banks et al. | 430/270 |
| 4,916,046 | 4/1990 | Doessel | 430/281 |
| 4,992,571 | 2/1991 | Fukuyama et al. | 566/64 |
| 5,037,575 | 8/1991 | Miura et al. | 430/70 |
| 5,055,376 | 10/1991 | Saeva | 430/270 |
| 5,084,371 | 1/1992 | Schwalm et al. | 430/270 |
| 5,102,771 | 4/1992 | Vogel et al. | 430/270 |
| 5,141,969 | 8/1992 | Saeva et al. | 430/270 |
| 5,219,703 | 6/1993 | Bugner et al. | 430/200 |
| 5,227,498 | 7/1993 | Lee et al. | 549/404 |
| 5,227,499 | 7/1993 | McGowan et al. | 549/404 |
| 5,278,031 | 1/1994 | Boggs et al. | 430/348 |
| 5,286,612 | 2/1994 | Telfer | 430/335 |
| 5,334,489 | 8/1994 | Grasshoff et al. | 430/335 |

FOREIGN PATENT DOCUMENTS

| 537975 | 4/1993 | European Pat. Off. . |
|---|---|---|
| WO 92/11581 | 7/1992 | WIPO . |

OTHER PUBLICATIONS

Beringer, F.M. et al., J. Am. Chem. Soc., 60, 141 (1956).
Berry et al., Chemically Amplified Resists for I–line and G–line Applications, SPIE 1262, 575 (1990).
Bi, Y. et al., J. Photochem. Photobiol. A: Chem, 74, 221 (1993).
Bou et al., Tetrahedron Letters, 23(3), 361 (1982).
Cohen S. and Cohen, S. G., J. Am. Chem. Soc., 88, 1533 (1966).
Crivello et al., J. Polym. Sci., Polym. Chem. Ed., 16, 2441 (1978).
Crivello et al., J. Polym. Sci., Polym. Chem. Ed., 19, 539 (1981).
Crivello et al., J. Polym. Sci., Polym. Chem. Ed. 21, 1097 (1983).
Crivello et al., J. Polym. Sci., Polym. Chem. Ed., 21, 97 (1983).
Dehmlow et al., Chem. Ber. 113(1), 1–8 (1979).
Dehmlow et al., Chem. Ber. 121(3), 569–71 (1988).
Fouassier et al., J. Imag. Sci. Tech., 37(2), 208 (1993).
Islam, N. et al., Tetrahedron 43, 959–970 (1987).
Ito et al., Polymer Sci. Eng. 23(18), 1012 (1983).
Lockhart, T.P., J. Am. Chem. Soc., 105(7), 1940 (1983).
Mitchell, R.D. et al., J. Imag. Sci., 30(5), 215 (1986).
Ohe, Y. et al., J. Imag. Sci. Tech., 37(3), 250 (1993).
Pappas, S.P. et al., Progress in Organic Coatings, 13, 35 (1964).
Pericas et al., Tetrahedron Letters, (1977), 4437–38.
Ptitsyna et al., Zh. Organ. Khim., 6(7), 1353 (1970) (English translation only).
Reichmanis et al., Chemical Amplification Mechanism for Microlithography, Chem. Mater., 3(3), 394 (1991).
Wallraff, G.M. et al., J. Imag. Sci. Tech., 36(5), 468 (1992).

Primary Examiner—Charles L. Bowers, Jr.
Assistant Examiner—John A. McPherson
Attorney, Agent, or Firm—David J. Cole

[57] ABSTRACT

A process for producing and fixing an image uses an imaging medium comprising an acid-generating layer or phase comprising a mixture of a superacid precursor, a sensitizer and a secondary acid generator, and a color-change layer comprising an image dye. The sensitizer can absorb radiation of a sensitizer wavelength which does not, in the absence of the sensitizer, cause decomposition of the superacid precursor to form the corresponding superacid. The secondary acid generator is capable of acid-catalyzed thermal decomposition by the first acid to form a second acid, and the image dye undergoes a color change upon contact with the second acid. The medium is imagewise exposed to radiation of the sensitizer wavelength, thereby causing the sensitizer, in exposed areas, to decompose superacid precursor with formation of the fist acid. The medium is then heated to cause, in the exposed areas, acid-catalyzed thermal decomposition of the secondary acid generator and formation of the second acid. The components of the acid-generating and color-change layers or phases are mixed so that in exposed areas, the second acid causes the image dye to change color. At least the non-exposed areas, a copper compound and a reactive material more reactive than the image dye to the products resulting from decomposition of the superacid precursor in the presence of the copper compound, are used to decompose the superacid precursor and fix the image.

35 Claims, 3 Drawing Sheets

PROCESS FOR FIXING AN IMAGE, AND MEDIUM FOR USE THEREIN

REFERENCE TO THE RELATED APPLICATIONS

U.S. Pat. No. 5,334,489 and copending U.S. application Ser. No. 08/151,860 (both of which are assigned to the same assignee as the present application), and the corresponding International Application No. PCT/US93/10224 (Publication No. WO 94/10607), all describe imaging processes which comprise imagewise exposing a superacid precursor to actinic radiation effective to generate superacid from the superacid precursor; heating the superacid while the superacid is admixed with a secondary acid generator capable of undergoing thermal decomposition to produce a second acid, the thermal decomposition of the secondary acid generator being catalyzed by the superacid, the heating being continued for a temperature and time sufficient to cause the superacid to produce second acid from the secondary acid generator; and during or subsequent to the heating, contacting the secondary acid with an acid-sensitive material which changes color in the presence of the second acid. (For convenience, the type of process disclosed in this patent and applications will hereinafter be called the '860 process.)

U.S. application Ser. No. 08/141,852, filed Oct. 22, 1993, and its parent application Ser. No. 07/965,161 (now U.S. Pat. No. 5,286,612; both these applications are assigned to the same assignee as the present application) describe an imaging process using an imaging medium comprising an acid-generating layer or phase and a color-change layer or phase. (For convenience, the type of process disclosed in this patent and applications will hereinafter be called the '612 process.) The acid-generating layer or phase comprises a mixture of a superacid precursor, a sensitizing dye and a secondary acid generator. The sensitizing dye is capable of absorbing radiation of a first wavelength which does not, in the absence of this dye, cause decomposition of the superacid precursor to form the corresponding superacid. The superacid precursor is capable of being decomposed, by radiation of a second wavelength shorter than the first wavelength, to form superacid. The secondary acid generator is capable of acid-catalyzed thermal decomposition by unbuffered superacid to form a second acid. The color-change layer or phase comprises an image dye which undergoes a change in its absorption of radiation upon contact with the second acid. This medium is imaged by first imagewise irradiating it with radiation of the first wavelength, which causes decomposition of part of the superacid precursor, without formation of unbuffered superacid but with formation of a protonated product derived from the dye. Thereafter, the whole medium is irradiated with radiation of the second wavelength, with decomposition of part of the remaining superacid and formation of unbuffered superacid only in areas of the medium exposed to the first, imagewise irradiation. The medium is then heated; in areas exposed to radiation of the first wavelength (hereinafter called the "exposed areas"), the unbuffered superacid causes acid-catalyzed decomposition of the secondary acid generator, thereby causing the formation of a molar amount of second acid much larger than the molar amount of unbuffered superacid present before the heating. In the non-exposed areas, however, since no unbuffered superacid is present, no significant generation of second acid takes place during the heating. Thereafter, the medium is further heated (in practice the two heating steps can be combined) to cause the components present in the two layers or phases to mix, so that, in exposed areas, the second acid brings about the absorption change in the image dye, thereby forming an image. Thus, the imaging medium is a single sheet which develops its image without any need for treatment with a developing composition and without requiring any waste material to be peeled from the medium to produce the final image.

(The term "unbuffered superacid" is used herein to refer to superacid which is not buffered by the sensitizer, and which thus provides an acidic species stronger than that provided by buffered superacid, that is to say superacid buffered by the sensitizer. Because of the extreme acidity of superacids and their consequent tendency to protonate even species which are not normally regarded as basic, it is possible, and indeed likely, that "unbuffered superacid" will in fact be present as a species buffered by some component of the imaging medium less basic than the sensitizer. However, such buffering by other species may be ignored for present purposes, so long as superacid is present as an acidic species stronger than that provided by superacid buffered by the sensitizer.)

U.S. application Ser. No. 08/232,725 of even date herewith and assigned to the same assignee as the present application, describes a modified form of the '612 process (hereinafter called the "indicator sensitizing dye process") using a sensitizing dye having a unprotonated form and a protonated form, the protonated form having substantially greater substantial absorption in a first wavelength range than the unprotonated form. While at least part of the sensitizing dye is in its protonated form, the medium is imagewise exposed to actinic radiation in the first wavelength range, thereby causing, in the exposed areas of the acid-generating layer or phase, the sensitizing dye to decompose at least part of the superacid precursor, with formation of unbuffered superacid. Acid-catalyzed thermal decomposition of the secondary acid generator and formation of the second acid, followed by admixture of the two layers or phases of the medium, are then effected as in the '612 process. Finally, sufficient base is introduced into the non-exposed areas of the medium to restore the sensitizing dye to its unprotonated form. This indicator sensitizing dye process has the advantage that the imagewise exposure can be carried out in the same wavelength range as that in which the image is to be viewed.

The entire disclosures of the aforementioned applications and of U.S. Pat. Nos. 5,286,612 and 5,334,489 are herein incorporated by reference.

BACKGROUND OF THE INVENTION

This invention relates to a process for fixing an image, and to an imaging medium for use in this process. More specifically, this invention relates to a process capable of fixing images produced by the aforementioned '860, '612 and indicator sensitizing dye processes, although the fixing process of the invention may also be useful for fixing images produced by other processes but having unchanged superacid precursor present in the non-exposed areas of the final image.

As discussed in the aforementioned applications, some conventional non-silver halide photosensitive compositions, for example photoresists, contain molecules which are inherently photosensitive, so that absorption of a single photon brings about decomposition of only the single molecule which absorbs the photon. However, a dramatic increase in the sensitivity of such photosensitive compositions can be achieved if the photosensitive molecule initiates a secondary reaction which is not radiation-dependent and which effects conversion of a plurality of molecules for each photon absorbed. For example, photoresist systems are known in which the primary photochemical reaction produces an acid, and this acid is employed to eliminate acid-labile groups in a secondary, radiation-independent reaction.

U.S. Pat. No. 4,916,046 describes a positive radiation-sensitive mixture using a monomeric silylenol ether, and a recording medium produced therefrom. This patent also contains an extensive discussion of radiation-sensitive compositions which form or eliminate an acid on irradiation. According to this patent, such radiation-sensitive compositions include diazonium, phosphonium, sulfonium and iodonium salts, generally employed in the form of their organic solvent-soluble salts, usually as deposition products with complex acids such as tetrafluoroboric acid, hexafluorophosphoric acid, hexafluoroantimonic acid and hexafluoroarsenic acid; halogen compounds, in particular triazine derivatives; oxazoles, oxadiazoles, thiazoles or 2-pyrones which contain trichloromethyl or tribromomethyl groups; aromatic compounds which contain ring-bound halogen, preferably bromine; a combination of a thiazole with 2-benzoylmethylenenaphthol; a mixture of a trihalomethyl compound with N-phenylacridone; α-halocarboxamides; and tribromomethyl phenyl sulfones.

The aforementioned phosphonium, sulfonium and iodonium salts are superacid precursors which, upon exposure to ultraviolet radiation, decompose to produce superacids, that is to say acids with a $pK_a$ less than about 0. Other materials decompose to produce superacids in a similar manner.

The aforementioned applications describe processes in which imagewise breakdown of a superacid precursor to produce unbuffered superacid is effected using imagewise exposure of the medium to radiation of a wavelength which, in the absence of the sensitizer, will not cause breakdown of the superacid precursor. The imagewise distribution of unbuffered superacid thus produced is used to catalyze the thermal breakdown of the secondary acid generator, thus producing, in the exposed areas of the medium, a molar quantity of the second acid larger than the molar quantity of unbuffered superacid present in these areas. The second acid is used to bring about the absorption change (hereinafter sometimes called "color change," with the understanding that the "color" may not be in the wavelength range visible to the human eye) of the indicator dye, thus forming an image.

At least the non-exposed areas of the image thus produced still contain unchanged superacid precursor, and this superacid precursor is still susceptible to decomposition by electromagnetic radiation with formation of acid. Such post-imaging generation of acid will also occur in the exposed areas if, as is usually the case, unchanged superacid precursor is also present in these areas. Unfortunately, in practice it is usually necessary to incorporate into this type of imaging medium a molar quantity of superacid precursor substantially larger than the molar quantity of superacid required for imaging, since the quantum yield for the generation of superacid during the imagewise exposure (and hence the overall sensitivity of the imaging process) is dependent upon the concentration of superacid precursor present, and a substantial excess of superacid precursor is needed for optimum quantum yield. In fact, the optimum molar quantity of superacid precursor may be a substantial fraction of the molar quantity of second acid generated by complete thermal breakdown of the secondary acid generator. For example, the aforementioned U.S. Pat. No. 5,286,612 describes a '612 imaging medium containing 1 mole of sensitizing dye, 5 moles of superacid precursor and a quantity of secondary acid generator sufficient to yield 10 moles of second acid. Accordingly, most images produced using media of the '612 or indicator sensitizing dye types are susceptible to post-imaging changes due to unwanted superacid precursor decomposition and acid generation in non-exposed areas.

One method for preventing such post-imaging changes is to treat the imaged medium with, or incorporate into the imaging medium, a reagent which will destroy the remaining superacid precursor, and a number of such reagents are known. However, selecting a suitable reagent to effect post-imaging destruction of excess superacid precursor in an '860, '612 or indicator sensitizing dye medium is attended by numerous difficulties. The reagent must not substantially affect the $D_{min}$ of the imaging medium, and also must not strongly absorb the wavelength(s) used in the imaging process so as to interfere with this process. The reagent should be soluble or dispersible in the coating solutions normally used to prepare such media, and must be compatible with all the other components of such media and solutions. Finally, the reagent must not cause any unwanted color-forming reactions before, during or after imaging.

It is well known that reducing agents are capable of decomposing superacid precursors, and in particular that copper(I) species are capable of catalytic decomposition of at least iodonium and diazonium superacid precursors. However, the requirement that the reagent not cause any unwanted color-forming reactions is especially difficult in view of the manner in which superacid precursors decompose in the presence of copper. The preferred superacid precursors for use in the '860, '612 and indicator sensitizing dye processes are iodonium compounds, especially diaryliodonium compounds, and in the presence of copper such compounds decompose with the formation of reactive electrophilic species; other superacid precursors similarly decompose with formation of reactive electrophilic species. These reactive electrophilic species react with the most suitable nucleophilic site available, which (the present inventors have found) may be the image dye itself, and such reactions with the image dye are highly undesirable, since they tend to produce irreversibly colored products and hence produce unwanted color in the imaging medium.

The present inventors have discovered that a combination of a copper compound and a nucleophilic material is capable of fixing an '860, '612 or indicator sensitizing dye image without substantially affecting the color of the image.

SUMMERY OF THE INVENTION

This invention provides a process for producing and fixing an image. This process uses an imaging medium comprising an acid-generating layer or phase comprising a mixture of a superacid precursor, a sensitizer and a secondary acid generator, and a color-change layer comprising an image dye. The sensitizer is capable of absorbing actinic radiation of a sensitizer wavelength which does not, in the absence of the sensitizer, cause decomposition of the superacid precursor to form a first acid. The secondary acid generator is capable of acid-catalyzed thermal decomposition by the first acid to form a second acid, and the image dye undergoes a change in its absorption of radiation upon contact with the second acid. In the present process, the medium is imagewise exposed to actinic radiation of the sensitizer wavelength, thereby causing, in the exposed areas of the acid-generating layer or phase, the sensitizer to decompose at least part of the superacid precursor, and this imagewise exposure leads to imagewise formation of first acid in the acid-generating layer. Thereafter, the medium is heated to cause, in the exposed areas of the acid-generating layer or phase, acid-catalyzed thermal decomposition of the secondary acid generator and formation of the second acid. The components of the acid-generating and color-change layers or phases are mixed, thereby causing, in the exposed areas of the medium, the second acid to bring about the change in absorption of the image dye and thereby form the image. Finally, in at least the non-exposed areas of the medium, there are reacted, with the superacid precursor, a copper compound and a reactive material more reactive than the image dye to the products resulting from decomposition of the superacid precursor in the presence of the copper compound, thereby causing the copper compound and the reactive material to bring about decomposition of the superacid precursor remaining in the non-exposed areas, and thereby fix the image.

This invention also provides an imaging medium comprising an acid-generating layer or phase comprising a mixture of a superacid precursor, a sensitizer and a secondary acid generator, and a color-change layer comprising an image dye. In this medium, the sensitizer is capable of absorbing actinic radiation of a sensitizer wavelength which does not, in the absence of the sensitizer, cause decomposition of the superacid precursor to form a first acid, the secondary acid generator is capable of acid-catalyzed thermal decomposition by the first acid to form a second acid, and the image dye undergoes a change in its absorption of radiation upon contact with the second acid. The imaging medium further comprises a copper compound and a reactive material as defined above, the copper compound and the reactive material being capable of bringing about the decomposition of the superacid precursor.

Finally, this invention provides a process for fixing an image in an imaging medium, the imaging medium having exposed areas comprising an image dye at least part of which is in protonated form, an acid, and a sensitizer, and non-exposed areas comprising the image dye in unprotonated form, the sensitizer, a superacid precursor and a secondary acid generator. In this imaging medium, the sensitizer is capable of absorbing actinic radiation of a sensitizer wavelength which does not, in the absence of the sensitizer, cause decomposition of the superacid precursor to form a first acid, and the secondary acid generator is capable of acid-catalyzed thermal decomposition by the first acid to form a second acid. The fixing process comprises reacting, with the superacid precursor, in at least the non-exposed areas of the medium, a copper compound and a reactive material as defined above, thereby causing the copper compound and the reactive material to bring about decomposition of the superacid precursor in the non-exposed areas, and thereby fixing the image.

It should be noted that, in some processes of the present invention, such as the '612 process described above, more than the imagewise exposure of the imaging medium to the radiation of the first wavelength is needed to produce the imagewise distribution of first acid in the medium.

DETAILED DESCRIPTION OF THE INVENTION

Figure 1A:
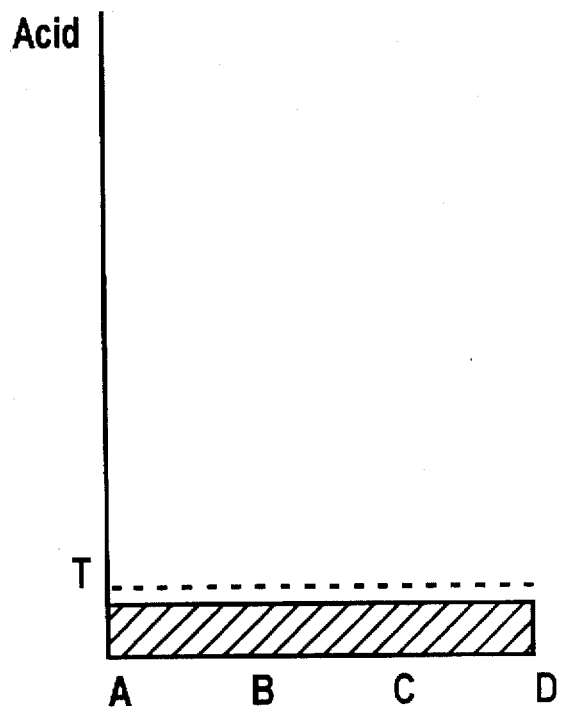
FIGS. 1A–1D show the acid concentrations in the exposed and non-exposed areas of the acid-generating layer during the various steps of a first preferred process of the present invention.

As already described, in the process of the present invention, a copper compound and a reactive material are used to bring about the decomposition of the superacid precursor remaining in at least the non-exposed areas of the image, thus fixing the image and rendering it no longer susceptible to changes caused by radiation which could otherwise decompose the superacid precursor. The copper compound catalyzes the decomposition of the superacid precursor, with formation of at least one electrophilic species, while the reactive material serves to react with the electrophilic species, thus preventing reaction between the electrophilic species and the image dye, and preventing this electrophilic species/image dye reaction destroying or undesirably affecting the image.

The copper compound used in the present process must of course be one which is effective in catalyzing the decomposition of the superacid precursor, and it appears that a copper(I) species is required for such catalysis. For example, copper(I) acetate may be used in the process. However, it is not necessary that the copper compound actually added to the imaging medium be a copper(I) species, since adding a copper(II) salt and a reducing agent will generate the necessary copper(I) species in situ, and in general the use of a copper(II) species and a reducing agent is more convenient in view of the susceptibility of copper(I) salts to air oxidation. The copper compound used must also, of course be compatible with the other components of the imaging medium; if, as is typical, the copper compound is incorporated into a layer or phase of the imaging medium containing a polymeric binder, the copper compound should be one which is readily dispersed in such a polymer binder. Preferred copper(II) salts include copper(II) acetate, copper(II) ethylacetoacetate, copper(II) acetylacetonate and copper(II) trifluoroacetylacetonate. Since the copper compound is a catalyst for decomposition of the superacid precursor, it is not necessary to use a molar quantity of copper equal to the molar quantity of superacid precursor remaining after imaging, and indeed the use of such a large amount of copper may be undesirable since the copper may contribute slightly to the $D_{min}$ of the image. The optimum amount of copper may be determined by routine empirical tests, but typically it has been found that about 1 mole of copper for every 10 moles of superacid precursor remaining after imaging is sufficient.

When a copper(II) salt is used together with a reducing agent, the reducing agent may be of any type which is effective in reducing copper(II) to copper(I) and which is compatible with the other components of the imaging medium. Conveniently the reducing agent is a secondary alcohol. The amount of reducing agent present should be sufficient to reduce all the copper(II) to copper (I). In some cases, it may not be necessary to provide the reducing agent as a separate component of the imaging medium, since some polymeric binders used in imaging media, e.g., poly(vinyl alcohol), contain appropriate reducing groups, and thus can themselves function as the reducing agent. Thus, the reducing agent may have the form of a polymeric binder in at least one of the acid-generating and color-change layers or phases of the imaging medium. Obviously, if the polymeric binder functions as the reducing agent, more than enough reducing agent will normally be present.

As already indicated, copper(I) catalyzed decomposition of superacid precursors is believed to be accompanied by generation of reactive electrophilic species, and unless an appropriate reagent is present to react with these electrophilic species, they tend to cause undesirable color formation in the imaging medium. The choice of the reactive material used in the present process is important in reducing such undesirable color formation. The reactive material should be chosen so that the reactive electrophilic species generated by decomposition of the superacid precursor with copper react with the reactive material rather than with the image dye, and accordingly the reactive material should be a better nucleophile than the image dye. Preferred reactive materials for use in the present process are carboxylates. These carboxylates, in addition to being more nucleophilic than the image dye, should be derived from a carboxylic acid which is significantly less acidic than the protonated form of the image dye. The carboxylates can also function as a base required to neutralize any second acid which may be generated in non-exposed areas of the imaging medium.

Alternatively, the reactive material may be a nucleophilic amine. Suitable amines include primary amines (for example, 2-aminoethylimidazolidone), secondary amines and nucleophilic tertiary amines (for example, 4-dimethylaminopyridine). Non-nucleophilic tertiary amines, for example pentamethylpiperidines, are not recommended for use in the present process since they do not appear to be effective in preventing reaction between the electrophilic species and most image dyes.

The molar amount of the reactive material provided should be at least equal to the molar amount of superacid precursor present, and preferably an additional amount of a basic material (which may or may not be the same as the reactive material) should be provided to permit neutralization of any second acid generated by breakdown of the secondary acid generator before or during imaging.

The present process is not restricted to any particular method for the introduction of the copper compound and the basic material into the non-exposed areas of the medium. However, obviously for convenience the copper compound and the basic material are provided within the imaging medium prior to imaging. Desirably the copper compound and the basic material are incorporated into the color-change layer or phase of the medium, although one or both may if desired be incorporated into a third layer or phase separate from both the acid-generating and color-change layers, provided that the components of this third layer or phase become intermixed with the components of the acid-generating and color-change layers or phases during the heating step of the process. Incorporation of the copper compound into the acid-generating layer or phase is specifically not recommended, since the copper may tend to cause premature breakdown of the superacid precursor prior to imaging. The reactive material should not, of course, be incorporated into the acid-generating layer or phase since it will decompose the first acid generated during the imaging process and required for decomposition of the secondary acid generator and consequent formation of the image.

Apart from the use of the copper/basic material fixing agent, the process of the present invention may be of any of the types described in the aforementioned applications, and two preferred processes of the invention will now be described with reference to Tables 1 and 2 below; FIGS. 1A–1D of the accompanying drawings show the changes in acid concentration in exposed and non-exposed areas of the acid-generating layer at various stages during the second of these two preferred processes. For ease of illustration, FIGS. 1A–1D are not strictly to scale. Furthermore, in some parts of Tables 1 and 2 there may be some doubt as to which species are actually protonated and which salts are formed, and this may depend upon whether the various reactions are controlled thermodynamically or kinetically. However, these doubts do not affect the essential results of the imaging and fixing processes. The last section of each of Tables 1 and 2 shows the composition of the combined acid-generating and color-change layers after the components thereof have become intermixed.

TABLE 1

| EXPOSED AREA | | NON-EXPOSED AREA | |
|---|---|---|---|
| Component | Moles | Component | Moles |
| PRIOR TO EXPOSURE | | | |
| VPy | 1 | VPy | 1 |
| Secondary acid generator | 10 | Secondary acid generator | 10 |
| $Ph_2I^+SbF_6^-$ | 5 | $Ph_2I^+SbF_6^-$ | 5 |
| AFTER IMAGEWISE EXPOSURE | | | |
| Ph-VPy | 0.75 | VPy | 1 |
| VPy | 0.25 | Secondary acid generator | 10 |
| $HSbF_6$ | 0.75 | $Ph_2I^+SbF_6^-$ | 5 |
| Secondary acid generator | 10 | | |
| $Ph_2I^+SbF_6^-$ | 4.25 | | |
| AFTER HEATING | | | |
| Ph-VPy | 0.75 | VPy | 1 |
| VPy | 0.25 | Secondary acid generator | 10 |
| $HSbF_6$ | 0.75 | $Ph_2I^+SbF_6^-$ | 5 |
| Second acid | 10 | | |
| $Ph_2I^+SbF_6^-$ | 4.25 | | |
| AFTER FIXING | | | |
| Ph-VPy | 0.75 | VPy | 1 |
| VPy | 0.25 | PhOAc | 5 |
| PhOAc | 4.25 | KOAc | 1 |
| HOAc | 1.75 | $KSbF_6$ | 5 |
| $KSbF_6$ | 5 | Cu reagent | 1 |
| Cu reagent | 1 | Secondary acid generator | 10 |
| Image dye/second acid salt | 9 | Unprotonated image dye | 10 |
| Unprotonated image dye | 1 | | |
| K/second acid salt | 1 | | |

The first preferred process of the present invention is of the '860 type and uses a conventional non-basic polycyclic aromatic sensitizer, 1-vinylpyrene (VPy) being shown in Table 1. As shown in this Table, prior to imaging both the exposed and non-exposed areas of the imaging medium comprises a quantity (shown in Table 1 as 1 mole for simplicity; all references to moles concerning Tables 1 and 2 (see below) refer to moles per unit area of the imaging medium, and are only by way of illustration, since the proportions of the various components may vary widely) of the vinylpyrene sensitizer, a larger molar quantity of a superacid precursor (5 moles of $Ph_2I^+SbF_6^-$ are shown in Table 1) and a still larger molar quantity (10 moles are shown in Table 1) of a secondary acid generator.

The imaging medium is first imagewise irradiated with radiation of a sensitizer wavelength (conveniently 365 nm for the vinylpyrene) which is absorbed by the sensitizer. This ultra-violet imagewise exposure causes, in the exposed areas, the sensitizer to bring about decomposition of part of the superacid precursor with formation of unbuffered superacid, since a non-basic sensitizer is used. Table 1 shows, for purposes of illustration, 0.75 mole of superacid precursor being decomposed during the imagewise exposure.

The secondary reactions that follow the fragmentation of the superacid precursor are not entirely understood at present. However, it is likely that a phenyl radical is generated, which subsequently becomes attached to the radical cation derived from the non-basic polycyclic aromatic sensitizer (i.e., vinylpyrene) used, following which elimination of a proton occurs, with formation of a phenylated form of the sensitizer, shown in Table 1 as "Ph-VPy." The exact site to which the phenyl radical becomes attached does not affect the essential imaging and fixing process of the invention.

Thus, at the end of the imagewise irradiation, unbuffered superacid is present in the exposed areas, whereas in the non-exposed areas no unbuffered superacid is present. In effect, the acid-generating layer already contains a "latent image" in superacid, although this image is not visible to the human eye. (The composition of the non-exposed areas of course remains unchanged by the imagewise visible exposure.)

The imaging medium is next heated. In the exposed areas, the unbuffered superacid present catalyzes the decomposition of the secondary acid generator, thus producing a large quantity of the second acid (10 moles are shown by way of example in Table 1). However, in the non-exposed areas, no unbuffered superacid is present, so that essentially no decomposition of the secondary acid generator occurs and essentially no second acid is generated.

In the final step of the process, as discussed in more detail below, the components of the acid-generating and color change layers become intermixed. Table 1 assumes that the color-change layer contains 10 moles of an indicator image dye, 1 mole of copper compound, 1 mole of a reducing agent (the products produced by oxidation of this reducing agent are ignored in Table 1 for simplicity) and 6 moles of a reactive material, shown as potassium acetate in Table 1 (where acetate is abbreviated "OAc"). In both the exposed and non-exposed areas, the copper compound, the reducing agent and the reactive material decompose all remaining superacid precursor, with generation by the reactive material of the corresponding amount of phenyl acetate (Table 1 assumes), phenyl iodide (omitted from Table 1) and potassium hexafluoro-antimonate. (In practice, the decomposition of the superacid precursor is probably somewhat more complicated, and other products may be produced; however, the exact type of decomposition products produced does not affect the essential nature of the present process.)

In the exposed areas, the unbuffered superacid present is immediately neutralized by the potassium acetate. The decomposition of the superacid precursor and the neutralization of the superacid consumes 5 moles of potassium acetate; the last mole of potassium acetate neutralizes 1 mole of the second acid, leaving 9 moles of second acid to reversibly protonate, and form a salt with, the image dye, thus causing the color change of this image dye. 1 Mole of the image dye remains in its unprotonated, leuco form.

In the non-exposed areas, the decomposition of the superacid precursor consumes 5 moles of potassium acetate, leaving 1 mole of potassium acetate remaining in these areas. None of the image dye is protonated, all remaining in its unprotonated, leuco form. The provision of the excess potassium acetate serves to ensure that, if a small amount of uncatalyzed thermal decomposition of the secondary acid generator does occur in non-exposed areas during the heating step, the small amount of second acid resulting will be neutralized by potassium acetate before the second acid can effect changes in the image dye. The excess potassium acetate also ensures that, if minor decomposition of the secondary acid generator does occur after the imaging process has been completed, the minor amounts of acid generated will be neutralized by the potassium acetate and thus will not affect image dye in the non-exposed areas of the final image.

It will be seen from Table 1 that the "neutralization" of the superacid by the potassium acetate produces acetic acid. Although acetic acid is normally regarded as an acid, it is insufficiently acidic in the polymeric binders in which the present process is normally carried out, to protonate the sensitizer or the image dye, and is thus not regarded as an acid for present purposes.

From the foregoing description, it will be seen that, in the exposed areas, the superacid catalyzes the breakdown of the secondary acid generator, so that the final quantity of second acid present is substantially larger than the quantity of unbuffered superacid produced directly by the imagewise radiation acting on the superacid precursor, although of course the secondary acid is typically a weaker acid than the superacid itself. This "chemical amplification" of the superacid by the secondary acid generator increases the number of moles of acid generated per einstein of radiation absorbed, and thus increases the contrast of the image produced by the present process as compared with simple generation of superacid by a superacid precursor. In practice, it has been found that, under proper conditions, at least 20, and in some cases 100 or more, moles of second acid can be liberated for each mole of unbuffered superacid present in the exposed areas following the imagewise irradiation.

The second preferred process shown in Table 2 below, and in FIGS. 1A–1D of the accompanying drawings, is of the indicator sensitizing type described in the aforementioned copending application Ser. No. 08/232,725 and uses as the sensitizer an indicator sensitizing dye having an unprotonated form and a protonated form.

TABLE 2

| EXPOSED AREA | | NON-EXPOSED AREA | |
|---|---|---|---|
| Component | Moles | Component | Moles |
| PRIOR TO USE | | | |
| [S-DYE] | 1 | [S-DYE] | 1 |
| Secondary acid generator | 10 | Secondary acid generator | 10 |
| $Ph_2I^+SbF_6^-$ | 5 | $Ph_2I^+SbF_6^-$ | 5 |
| AFTER INITIAL ULTRA-VIOLET EXPOSURE | | | |
| $[S-DYE-H]^+SbF_6^-$ | 0.75 | $[S-DYE-H]^+SbF_6^-$ | 0.75 |
| [S-DYE] | 0.25 | [S-DYE] | 0.25 |
| Secondary acid generator | 10 | Secondary acid generator | 10 |
| $Ph_2I^+SbF_6^-$ | 4.25 | $Ph_2I^+SbF_6^-$ | 4.25 |
| AFTER IMAGEWISE VISIBLE EXPOSURE | | | |
| $[S-DYE-H]^+SbF_6^-$ | 0.25 | $[S-DYE-H]^+SbF_6^-$ | 0.75 |
| $Ph-[S-DYE-H]^+SbF_6^-$ | 0.75 | [S-DYE] | 0.25 |
| $HSbF_6$ | 0.5 | Secondary acid generator | 10 |
| Secondary acid generator | 10 | $Ph_2I^+SbF_6^-$ | 4.25 |
| $Ph_2I^+SbF_6^-$ | 3.5 | | |
| AFTER HEATING | | | |
| $[S-DYE-H]^+SbF_6^-$ | 0.25 | $[S-DYE-H]^+SbF_6^-$ | 0.75 |
| $Ph-[S-DYE-H]^+SbF_6^-$ | 0.75 | [S-DYE] | 0.25 |
| $HSbF_6$ | 0.5 | Secondary acid generator | 10 |
| Second acid | 10 | $Ph_2I^+SbF_6^-$ | 4.25 |
| $Ph_2I^+SbF_6^-$ | 3.5 | | |
| AFTER FIXING | | | |
| [S-DYE] | 0.25 | [S-DYE] | 1 |
| Ph-[S-DYE] | 0.75 | HOAc | 0.75 |
| HOAc | 2.5 | KOAc | 1 |
| Image dye/second acid salt | 9 | Secondary acid generator | 10 |
| Unprotonated image dye | 1 | Cu reagent | 1 |
| PhOAc | 3.5 | PhOAc | 4.25 |

TABLE 2-continued

| EXPOSED AREA | | NON-EXPOSED AREA | |
| --- | --- | --- | --- |
| Component | Moles | Component | Moles |
| Cu reagent | 1 | Unprotonated image dye | 10 |
| $KSbF_6$ | 5 | $KSbF_6$ | 5 |
| K/second acid salt | 1 | | |

As shown in Table 2, the imaging medium initially contains the sensitizing dye in its unprotonated form. Both the exposed and non-exposed areas initially comprise 1 mole of the sensitizing dye, a larger molar quantity of a superacid precursor (5 moles of $Ph_2I^+SbF_6^-$ are shown in Table 1; a suitable quantity of a non-basic polycyclic aromatic sensitizer, such as pyrene, is also included in the medium but is not shown in Table 1) and a still larger molar quantity (10 moles are shown in Table 1) of a secondary acid generator.

The imaging medium is first blanket irradiated with radiation which is not absorbed by the sensitizing dye but is absorbed by the non-basic polycyclic aromatic sensitizer, with decomposition of superacid precursor, this radiation typically being near ultra-violet radiation; the amount of radiation applied is sufficient to cause the decomposition of less than one mole (0.75 mole is used for illustration in Table 2 and FIG. 1A) of the superacid precursor, thus producing a corresponding amount of superacid. This superacid immediately protonates the sensitizing dye, producing a salt of the dye shown as "$[S-DYE-H]^+SbF_6^-$" in Table 2, and leaving no unbuffered superacid present in the acid-generating layer. Thus, after this initial ultra-violet exposure, as shown in Table 2, all areas of the acid-generating layer contain 0.75 mole of the sensitizing dye salt, 0.25 mole of unprotonated sensitizing dye, 4.25 moles of superacid precursor and 10 moles of secondary acid generator. This situation is illustrated in FIG. 1A which shows the acid level as 0.75 times a threshold level (indicated by T in FIGS. 1A–1D) at which all the sensitizing dye becomes protonated.

(The phenyl radical generated by decomposition of the superacid precursor during this blanket exposure is ignored in Table 2, since as mentioned above in connection with Table 1, these phenyl radicals will usually become attached to the non-basic sensitizer. Even if some of the phenyl radicals generated do become attached to sensitizing dye molecules, this will not significantly affect the overall course of the process shown in Table 2 and FIG. 1, especially since a phenylated form of the sensitizing dye would be expected to undergo the same type of protonation and deprotonation reactions, with similar absorption shifts, as the non-phenylated dye.)

Figure 1B:
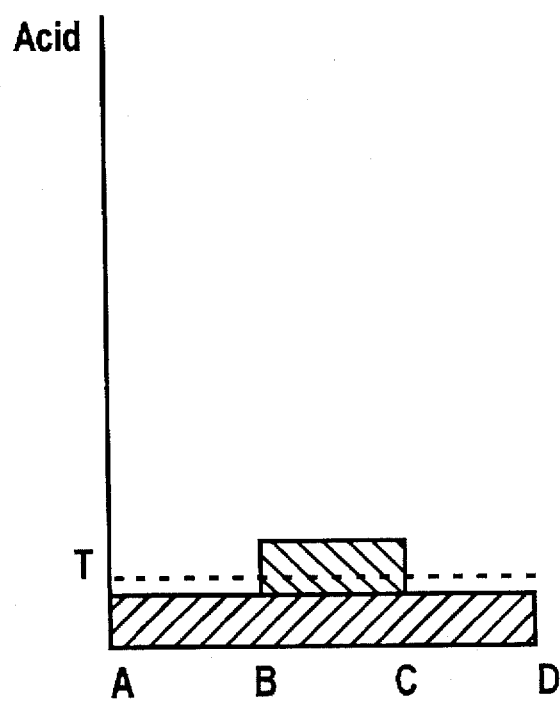

After the initial ultra-violet exposure, the imaging medium is imagewise exposed to radiation in the first wavelength range; visible radiation is shown for illustration in Table 2. As shown in Table 2 and FIG. 1B, in the area BC of the acid-generating layer which is exposed to the visible radiation, this visible radiation causes the protonated sensitizing dye to bring about the decomposition of a further 0.75 mole of superacid precursor, with generation of a further 0.75 mole of superacid, so that the total amount of acid present exceeds the threshold T. The additional superacid generated by the visible exposure protonates the remaining 0.25 mole of previously unprotonated sensitizing dye, leaving 0.5 mole of unbuffered superacid in the exposed area BC, as shown in FIG. 1B. For purposes of illustration, FIG. 1B shows the acid generated in the ultraviolet and visible exposures separately, although of course no difference exists chemically.) In the non-exposed areas AB and CD no change in the acid level occurs, the acid concentration remains below the threshold T, and no unbuffered superacid is present after the visible exposure.

Thus, at the end of the imagewise irradiation, unbuffered superacid is present in the exposed areas, whereas in the non-exposed areas no unbuffered superacid is present, all the superacid generated being buffered by the sensitizing dye. In effect, the acid-generating layer already contains a "latent image" in superacid, although this image is not visible to the human eye.

It is expected that the decomposition of the superacid precursor by the sensitizing dye during the imagewise visible exposure will be accompanied by phenylation of the photooxidized sensitizing dye by the phenyl radical derived from the superacid precursor, followed by elimination of a proton. Accordingly, at the end of the imagewise exposure, the exposed areas will contain 0.75 mole of a phenylated product derived from the protonated sensitizing dye, this product being denoted $Ph-[S-DYE-H]^+SbF_6^-$ in Table 2. The remaining 0.25 mole of sensitizing dye will remain in the $[S-DYE-H]^+SbF_6^-$ form. Also present in the exposed areas will be 0.5 mole of unbuffered superacid, the 3.5 remaining moles of superacid precursor, and the 10 moles of secondary acid generator, which remain unchanged at this point. (The composition of the non-exposed areas of course remains unchanged by the imagewise visible exposure.)

Figure 1C:
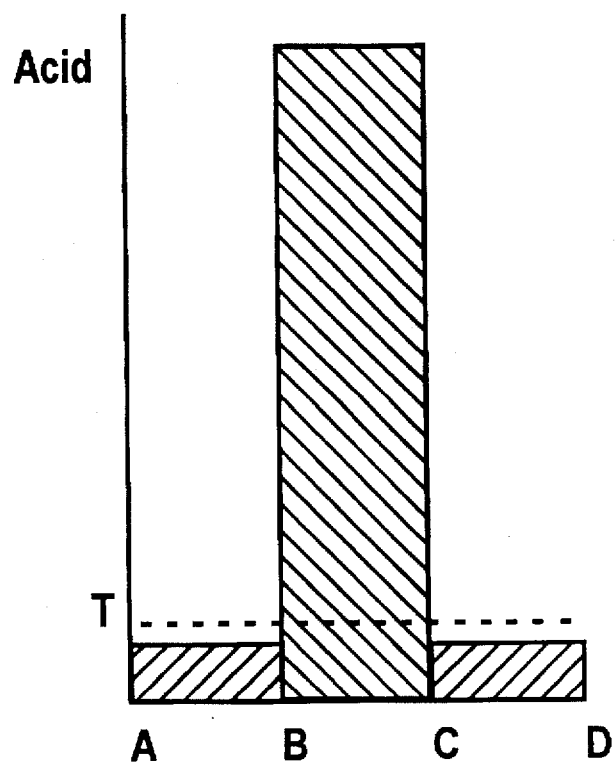

The imaging medium is next heated. In the exposed area BC, the unbuffered superacid present catalyzes the decomposition of the secondary acid generator, thus producing a large quantity of the second acid (10 moles are shown by way of example in Table 2; FIG. 1C is not strictly to scale). However, in the non-exposed areas AB and CD, no unbuffered superacid is present, and the sensitizing dye/superacid salt does not catalyze the decomposition of the secondary acid generator, so that essentially no decomposition of the secondary acid generator occurs and essentially no second acid is generated.

In the final step of the process, as discussed in more detail below, the components of the acid-generating and color change layers become intermixed. Table 2 assumes that the color-change layer contains 10 moles of an indicator image dye, 1 mole of copper compound, 1 mole of a reducing agent (the products produced by oxidation of this reducing agent are ignored in Table 2 for simplicity) and 6 moles of a reactive material, shown as potassium acetate in Table 2. Table 2 further assumes that the image dye is more basic than the sensitizing dye. In both the exposed and non-exposed areas, the copper compound, the reducing agent and the reactive material decompose all remaining superacid precursor, with generation of the corresponding amount of phenyl acetate (Table 2 assumes), phenyl iodide (omitted from Table 2) and potassium hexafluoroantimonate.

Figure 1D:
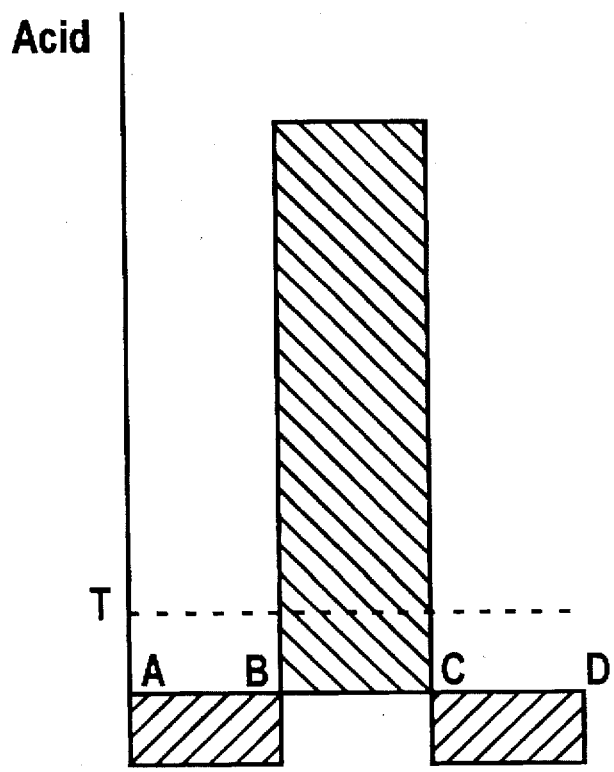

In the exposed areas, the unbuffered superacid present is immediately neutralized by the potassium acetate, which also deprotonates the protonated forms of both the original sensitizing dye and the phenylated form of this dye to produce the corresponding unprotonated dyes, thereby removing the absorption in the first wavelength range due to the sensitizing dye. The decomposition of the superacid precursor and the deprotonation of the superacid and the sensitizing dye consume 5 moles of potassium acetate; the last mole of potassium acetate neutralizes 1 mole of the second acid, leaving 9 moles of second acid to reversibly protonate, and form a salt with, the image dye, thus causing the color change of this image dye. 1 Mole of the image dye remains in its unprotonated, leuco form. FIG. 1D shows graphically the 9 moles of second acid remaining in the exposed areas.

In the non-exposed areas, the potassium acetate deprotonates the sensitizing dye, returning it to its unprotonated form, and thus reducing the $D_{min}$ of the image in this range (assuming, as is usual, that the absorption change in the image dye is an increase in absorption, i.e., increase in color, in the relevant wavelength range so that the non-exposed areas are the $D_{min}$ areas of the image). The decomposition of the superacid precursor and the deprotonation of the sensitizing dye consume 5 moles of potassium acetate; 1 mole of potassium acetate remains in the non-exposed areas. This excess of base is represented in FIG. 1D as −1 moles of remaining acid. None of the image dye is protonated, all remaining in its unprotonated, leuco form. The provision of the excess potassium acetate serves to ensure that, if a small amount of uncatalyzed thermal decomposition of the secondary acid generator does occur in non-exposed areas AB and CD during the heating step, the small amount of second acid resulting will be neutralized by base before the second acid can effect changes in the image dye, as described in more detail below. The excess potassium acetate also ensures that, if minor decomposition of the secondary acid generator does occur after the imaging process has been completed, the minor amounts of acid generated will be neutralized by the potassium acetate and thus will not affect image dye in the non-exposed areas of the final image.

The fixing process of the present invention may also be used with the type of indicator sensitizing dye process shown in Table 2 and FIGS. 2A–2E and accompanying description of the aforementioned application Ser. No. 08/232,725, which uses an indicator sensitizing dye capable to two stages of protonation.

One advantage of the present process is that, at least in many preferred embodiments of the invention, it is possible to compensate for any premature breakdown of the superacid precursor which may occur before use of the imaging medium. Such premature breakdown may occur, for example, by exposure of the imaging medium to radiation during transportation and storage or because the mixture of the superacid precursor and the sensitizing dye in the acid-generating layer or phase undergoes slow decomposition on protracted storage. If, as in the second of the two preferred processes described above, the first step of the process is blanket exposure of the imaging medium to radiation in the second wavelength range to generate superacid and convert the sensitizing dye to its protonated form, the blanket exposure can be adjusted to ensure that the present process works properly, even if some decomposition of the superacid precursor has occurred earlier.

For example, to take an extreme case purely for purposes of illustration, suppose that the imaging medium shown in Table 2 is exposed to so much ultra-violet radiation during storage and transport that premature breakdown of 0.5 mole of superacid precursor occurs. At the beginning of imaging, all areas of the medium thus contain 0.5 mole of sensitizing dye, 10 moles of secondary acid generator, 4.5 moles of superacid precursor and 0.5 mole of protonated sensitizing dye. After spectral analysis to determine the amount of protonated sensitizing dye already present, the initial ultra-violet exposure may be adjusted so that, in exposed areas, only a further 0.25 mole of superacid precursor is decomposed. After this exposure, the medium will contain 0.75 mole of protonated sensitizing dye, and will thus be in exactly the same condition as if no premature breakdown of the superacid precursor had occurred before imaging, but the initial ultra-violet exposure generated 0.75 mole of superacid. Also, provided that no substantial breakdown of superacid precursor occurs during transportation and storage, a medium of the present invention which is produced with the sensitizing dye in its unprotonated form is, prior to imaging, essentially insensitive to radiation of the wavelength used for the imagewise exposure, since the unprotonated sensitizing dye, even when exposed to such radiation, does not cause substantial decomposition of the superacid precursor.

For similar reasons, the present process is also relatively insensitive to variations in the radiation used for the imagewise exposure, such as variations in laser output, between individual lasers in an array used to form the imaging beam, timing errors in laser drivers, etc. For example, in the process shown in Table 2, the imagewise exposure causes decomposition of 0.75 mole of superacid precursor. If the imaging radiation delivered to the imaging medium varies by ±20%, some exposed areas will experience decomposition of 0.6 mole of superacid precursor, while others will experience decomposition of 0.9 mole. Thus, after the imagewise exposure, the concentration of unbuffered superacid in the exposed areas will vary from 0.35 to 0.65 mole. In practice, with appropriate control of the heating step, this range of variation in unbuffered superacid concentration will have minimal effects on the final image, especially in cases where the medium is designed to be essentially binary, i.e., any specific pixel is either at $D_{min}$ or at $D_{max}$.

Since the present process relies upon the production of a first acid strong enough to catalyze thermal decomposition of the secondary acid generator (this first acid may be unbuffered superacid), it is highly desirable that the process be conducted under essentially anhydrous conditions; as chemists are well aware, the most powerful acidic species that can exist in the presence of more than one equivalent of water is the hydroxonium (hydronium) ion, $[H_3O]^+$. Accordingly, if the medium in which the present process is conducted contains water, at least part of the first acid produced by the present process will simply generate hydroxonium ion. However, in the absence of water, the decomposition of the superacid precursor yields an acidic species much stronger than hydroxonium ion, and this acidic species can effect the acid-catalyzed decomposition of various secondary acid generators which hydroxonium ion cannot. Typically, the present process is carried out with the superacid precursor and the sensitizer dispersed in a polymeric binder, and such binders can readily be chosen to provide an essentially anhydrous environment for the process.

For the present process to occur, it is obviously necessary that the sensitizer, having absorbed the sensitizer radiation, initiate the decomposition of the superacid precursor. As is well known to those skilled in the art, for such initiation to occur, it is necessary to choose the sensitizer and the superacid precursor so that the excited state of the sensitizer can reduce the superacid precursor. The choice of appropriate pairs of sensitizers and superacid precursors may be made empirically, although techniques familiar to those skilled in the art, such as use of the Rehm-Weller Equation, may be used to reduce the amount of empirical testing necessary.

In principle, in the present process the mixing of the components of the acid-generating and color-change layers or phases should be effected after the generation of the second acid from the secondary acid generator. However, in practice both the generation of the second acid in the acid-generating layer and the mixing of the components of the two layers or phases may be effected in a single heating step, since the acid-catalyzed decomposition of the secondary acid generator will typically be essentially complete before mixing of the two layers or phases becomes significant, and thus before the copper compound and reactive material present in the color-change layer or phase begin to decompose the superacid present in the acid-generating layer or phase.

Obviously, it is important that the components of the acid-generating layer or phase and the color-change layer or phase not mix prematurely. In practice, the present imaging medium will typically be formed by coating acid-generating and color-change layers from a solution or dispersion on to a support. To prevent premature mixing, it is usually desirable to coat one layer from an aqueous medium and the other from a non-aqueous medium. Typically, the acid-generating layer is coated from an organic medium and the color-change layer from an aqueous medium. Thus, typically it is advantageous to use a copper compound and a reactive material which are readily water-soluble or—dispersible so that these components can be included in the aqueous medium used to coat the color-change layer.

Any of the known superacid precursors, for example diazonium, phosphonium, sulfonium and iodonium compounds, may be used in this invention, but iodonium compounds are preferred. Especially preferred superacid precursors are diphenyliodonium salts, specifically (4-octyloxyphenyl)phenyliodonium hexafluoro-phosphate and hexafluoroantimonate, bis(n-dodecylphenyl)iodonium hexafluoro-antimonate and 4-(2-hydroxytetradecyl-1-oxyphenyl)phenyl hexafluoroantimonate.

When the present process is of the '860 type, any conventional non-basic polycyclic aromatic sensitizer may be employed. When the present process is of the '612 type, any infra-red sensitizer capable of sensitizing decomposition of the superacid precursor with the production of unbuffered superacid may be employed. Preferably, the infra-red sensitizer is a squarylium dye, since squarylium dyes tend to have high infra-red extinction coefficients, have long singlet excited state lifetimes (which assists the electron transfer reactions upon which the present process depends), show little tendency to aggregate in polymeric films, and have low visible absorptions. Examples of infra-red dyes useful in the present process are:

a) dyes comprising an inner salt of a compound of the formula:
$$Q^1=Z-Q^2$$
wherein:
$Q^1$ is a 4-(benz[b]-4H-pyrylium)methylidene, 4-(benz[b]-4H-thiopyrylium)methylidene or 4-(benz[b]-4H-selenopyrylium)methylidene grouping;
Z is a 1,3-(2-hydroxy-4-oxo-2-cyclobutylidene) hydroxide or 1,3-(2-hydroxy-4,5-dioxo-2-cyclopentylidene) hydroxide ring; and
$Q^2$ is a 4-(benz[b]-4H-pyran-4-ylidene)methyl, 4-(benz[b]-4H-thiopyran-4-ylidene)methyl or 4-(benz[b]-4H-selenopyran-4-ylidene)methyl grouping;
wherein at least one of the groupings $Q^1$ and $Q^2$ carries at its 2-position a substituent in which a non-aromatic carbon atom is bonded directly to the benzpyrylium, benzthiopyrylium or benzselenopyrylium nucleus, subject to the proviso that if said 2-substituent contains an aromatic nucleus, this aromatic nucleus is not conjugated with the benzpyrylium, benzthiopyrylium or benzselenopyrylium nucleus to which it is attached (see U.S. application Ser. No. 08/126,427, filed Sep. 24, 1993 in the names of Stephen J. Telfer et al., and assigned to the same assignee as the present application, and the corresponding International Application No. PCT/US91/08695, Publication No. WO 92/09661);

b) squarylium compounds of the formula:

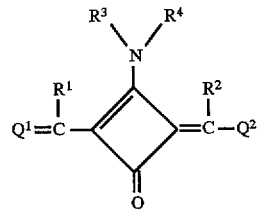

in which $Q^1$ and $Q^2$ are each a chromophoric group having an unsaturated system conjugated with the squarylium ring and such that in the compounds of formulae $Q^1CH_2R^1$ and $Q^2CH_2R^2$ the methylene hydrogens are active hydrogens, $R^1$ and $R^2$ are each independently a hydrogen atom or an aliphatic or cycloaliphatic group, and $R^3$ and $R^4$ are each independently a hydrogen atom, or an aliphatic, cycloaliphatic, aromatic or heterocyclic group, or one of $R^3$ and $R^4$ is a hydrogen atom and the other is an organosulfonyl group, or $R^3$ and $R^4$ together with the intervening nitrogen atom form a cycloaliphatic or aromatic ring (see U.S. Pat. No. 5,227,498 and the corresponding International Application No. PCT/US92/09992, Publication No. WO 93/09956); and c) squarylium compounds of the formula:

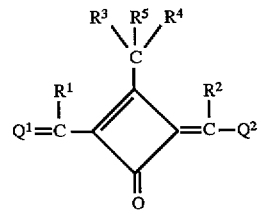

in which:
$Q^1$ and $Q^2$ are each a chromophoric group having an unsaturated system conjugated with the squarylium ring and such that in the compounds of formulae $Q^1CH_2R^1$ and $Q^2CH_2R^2$ the methylene hydrogens are active hydrogens;
$R^1$ and $R^2$ are each independently a hydrogen atom or an aliphatic or cycloaliphatic group; and
$R^3$, $R^4$ and $R^5$ are each independently a hydrogen atom, or an aliphatic, cycloaliphatic, aromatic or heterocyclic group, or an electron-withdrawing group able to lower the electron density at the carbon atom to which it is attached, subject to the provisoes that:
two of $R^3$, $R^4$ and $R^5$ may form a divalent group of which a single atom is double bonded to the carbon atom to which the two groups are attached, or all three of $R^3$, $R^4$ and $R^5$ may form a trivalent group of which a single atom is triple bonded to the carbon atom to which the three groups are attached, or
two of $R^3$, $R^4$ and $R^5$ may, together with the carbon atom to which they are attached, form a ring, or all three of $R^3$, $R^4$ and $R^5$ may, together with the carbon atom to which they are attached, form an unsaturated ring (see U.S. Pat. No. 5,227,499 and the corresponding International Application No. PCT/US92/09992, Publication No. WO 93/09956).

When the sensitizer used in the present process is an indicator sensitizing dye, it may be any molecule, the absorption spectrum of which depends reversibly upon its state of protonation and which can cause decomposition of the superacid precursor used, provided of course that the dye is compatible with the other components of the imaging medium. The state of the indicator sensitizing dye called herein the "unprotonated form" need not necessarily be a neutral molecule; the unprotonated form may be anionic but capable of being protonated to a neutral or cationic form. For example, fluorescein monomethyl ether can exist in a non-aqueous medium in anionic (deprotonated), neutral or cationic (protonated) forms; both the anionic and cationic forms are yellow, while the neutral form is colorless to the eye but absorbs strongly in the mid-ultra-violet region (around 320 nm). The spectral shift of the sensitizing dye upon protonation may be either hypsochromic (to shorter wavelength) or bathochromic (to longer wavelength). Fluorescein monomethyl ether exhibits both behaviors; the first protonation of the anionic form causes a hypsochromic shift, while the second protonation to the cationic form causes a bathochromic shift.

Preferred indicator sensitizing dyes for use in the present process include fluoran dyes, phthalide dyes, xanthene dyes, acridine dyes, hydroxypyrylium dyes, hydroxythiopyrylium dyes, styrylpyridinium dyes, styrylquinolinium dyes, and other substituted quinolinium, isoquinolinium and pyridinium dyes, with triarylpyridinium, quinolinium and xanthene dyes being especially preferred. Specific triarylpyridinium dyes which have been found useful in the present invention are protonated forms of:

2,4,6-tris(4-methoxyphenyl)pyridine;

2,6-bis(4-methoxyphenyl)-4-(2-thienyl)pyridine;

2,6-bis(4-methoxyphenyl)-4-(2-(4-bromophenyl) pyridine;

2,6-bis(4-methoxyphenyl)-4-(2-naphthyl)pyridine;

2,4-bis(4-methoxyphenyl)-6-(2-naphthyl)pyridine;

2,4,6-tris(2,4,6-trimethoxyphenyl)pyridine; and 2,6-bis(4-methoxyphenyl)-4-(2-(1,4-dimethoxy) naphthyl)pyridine.

A specific preferred triarylpyridinium dyes is the protonated form of 2,4,6-tris-(2,4-dimethoxyphenyl)pyridine.

A specific preferred quinolinium dye is the protonated form of 2-[2-[2,4-bis[octyloxy]phenyl]ethen-1-yl]quinoline (the unprotonated form of this dye is available from Yamada Chemical Co. Kyoto Japan), while a specific preferred xanthene dye is the protonated form of 3',6'-bis[N-[2-chlorophenyl]-N-methylamino]spiro[2-butyl-1,1-dioxo[1,2-benzisothiazole-3(3H),9'-(9H)xanthene]](which may be prepared as described in U.S. Pat. No. 4,345,017).

Methods for the preparation of triarylpyridinium dyes are described in the literature. One convenient method for the preparation of such dyes bearing identical substituents at the 2- and 6-positions is described in Weiss, J. Am. Chem. Soc., 74, 200 (1952) and comprises heating a mixture of an acetophenone, an aldehyde (that containing the desired 4-substituent) and ammonium acetate in acetic acid. A dihydropyridine is produced as the penultimate intermediate, but is oxidized to the pyridine by the intermediate chalcone. A second method is similar to the first, but uses hydroxylamine or unsymmetrical dimethylhydrazine in place of ammonium acetate; the penultimate intermediate in these cases are the N-hydroxydihydropyridine or N,N-dimethylaminodihydropyridine, which undergo elimination and aromatization without the need for an oxidizing agent. A third method, described in Krohnke, Synthesis, 1976, 1, can produce asymmetric triarylpyridinium dyes. In this third method, an aryl aldehyde containing the desired 4-substituent and an acetophenone containing the desired 2-substituent are reacted to form an intermediate chalcone, which is then reacted with the phenacylpyridinium salt derived from the acetophenone containing the desired 6-substituent. The resultant pyridinium-substituted dihydropyridine undergoes loss of pyridine with aromatization.

Any secondary acid generator that is capable of acid-catalyzed breakdown to give a second acid may be used in the present process. One preferred group of secondary acid generators are 3,4-disubstituted-cyclobut-3-ene-1,2-diones (hereinafter for convenience called "squaric acid derivatives") capable of generating squaric acid or an acidic derivative thereof, since squaric acid and its acidic derivatives are strong acids well suited to effecting color changes in acid-sensitive materials. Especially preferred squaric acid derivatives are those in which there is bonded to the squaric acid ring, via an oxygen atom, an alkyl or alkylene group, a partially hydrogenated aryl or arylene group, or an aralkyl group. The acid-catalyzed decomposition of these squaric acid derivatives causes replacement of the original alkoxy, alkyleneoxy, aryloxy, aryleneoxy or aralkoxy group of the derivative with a hydroxyl group, thereby producing squaric acid or an acidic squaric acid derivative having one hydroxyl group.

The exact mechanism by which squaric acid or an acidic derivative thereof is formed in the present process may vary depending upon the type of squaric acid derivative employed. In some cases, for example di-t-butyl squarate, one or both groups attached via oxygen atoms to the squaric acid ring may thermally decompose to yield an alkene or arene, thereby converting an alkoxy or aryloxy group to a hydroxyl group and forming the squaric acid or acidic derivative thereof. In other cases, for example 3-amino-4-(p-vinylbenzyloxy)cyclobut-3-ene-1,2-dione, there is no obvious mechanism for formation of a corresponding alkene or arene, and it appears that the mechanism of acid formation is migration of the vinylbenzyl carbocation or similar group to a different position within the molecule (probably to the amino group), and protonation of the remaining oxygen atom to form a hydroxyl group at the position from which the group migrates. In other cases, neither of these pathways is possible. However, in all cases the net effect is the replacement of the alkoxy, alkyleneoxy, aryloxy, aryleneoxy or aralkoxy group present in the original derivative with a hydroxyl group to form squaric acid or an acidic derivative thereof.

Those skilled in the art of organic chemistry will appreciate that the susceptibility to thermal decomposition of the squaric acid derivatives preferred for use in the present process is related to the stability of the cation produced from the ester grouping during the decomposition process. Although the stability of specific cations may be influenced by a variety of factors, including steric factors, which may be peculiar to a particular ester, in general it may be said that the squaric acid esters preferred for use in the present process are:

(a) primary and secondary esters of squaric acid in which the α-carbon atom (i.e., the carbon atom bonded directly to the —O— atom of the squarate ring) bears a non-basic cation-stabilizing group. This cation-stabilizing group may be, for example, an $sp^2$ or sp hybridized carbon atom, or an oxygen atom;

(b) tertiary esters of squaric acid in which the α-carbon atom does not have an $sp^2$ or sp hybridized carbon atom directly bonded thereto; and (c) tertiary esters of squaric acid in which the α-carbon atom does have an sp² or sp hybridized carbon atom directly bonded thereto, provided that this sp² or sp hybridized carbon atom (or at least one of these sp² or sp hybridized carbon atoms, if more than one such atom is bonded directly to the α-carbon atom) is conjugated with an electron-withdrawing group.

It will be apparent to skilled organic chemists that, provided one of the aforementioned types of ester groupings is present in the squaric acid derivative to produce one hydroxyl group after thermal decomposition, the group present in place of the other hydroxyl group of squaric acid is of little consequence, provided that this other group does not interfere with the thermal decomposition. Indeed, the wide variation possible in this other group has the advantage that this group can be varied to control other properties of the derivative, for example its compatibility with other components of the imaging medium, or its solubility in solvents used to form coating solutions used in the preparation of the imaging medium.

Examples of squaric acid derivatives useful in the present processes include:

(a) those of the formula:

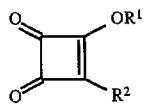
(I)

in which $R^1$ is an alkyl group, a partially hydrogenated aromatic group, or an aralkyl group, and $R^2$ is a hydrogen atom or an alkyl, cycloalkyl, aralkyl, aryl, amino, acylamino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer. Among the derivatives of Formula I, especially preferred groups are those in which (a) $R^1$ is an unsubstituted or phenyl substituted alkyl group containing a total of not more than about 20 carbon atoms, and $R^2$ is an alkyl group containing not more than about 20 carbon atoms, or a phenyl group (which may be substituted or unsubstituted); and (b) $R^1$ is a benzyl group and $R^2$ is an amino group.

(b) those of the formula:

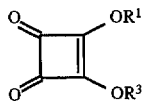
(II)

in which $R^1$ and $R^3$ independently are each an alkyl group, a partially hydrogenated aryl group or an aralkyl group, subject to the proviso that either or both of the groups $R^1$ and $R^3$ may be attached to a polymer. Among the derivatives of Formula II, an especially preferred group are those in which $R^1$ and $R^3$ are each independently an unsubstituted or phenyl substituted alkyl group containing a total of not more than about 20 carbon atoms. Specific preferred compounds of Formula II are those in which $R^1$ and $R^3$ are each a tertiary butyl group, a benzyl group, an α-methylbenzyl group or a cyclohexyl group, namely di-tertiary butyl squarate, dibenzyl squarate, bis(α-methylbenzyl) squarate and dicyclohexyl squarate.

(c) those of the formula:

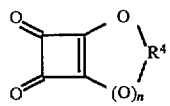
(III)

in which n is 0 or 1, and $R^4$ is an alkylene group or a partially hydrogenated arylene group. Among the derivatives of Formula III, an especially preferred group are those in which n is 1 and $R^4$ is an alkylene group containing not more than about 12 carbon atoms.

(d) those having at least one unit of the formula:

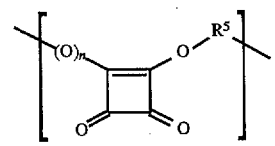
(IV)

in which n is 0 or 1, and $R^5$ is an alkylene or partially hydrogenated arylene group. Besides the fragmentable groups $R^5$, the compounds may also contain one or more units in which a non-fragmentable group is attached to a squarate ring, directly or via an oxygen atom.

The squaric acid derivatives of Formula IV include not only high polymers, but also dimers, trimers, tetramers, etc. including at least one of the specified units. The terminating groups on the derivatives of Formula IV may be any of groups $OR^1$ or $R^2$ discussed above with reference to Formula I. Thus, for example, Formula IV includes the squaric acid dimer derivative of the formula:

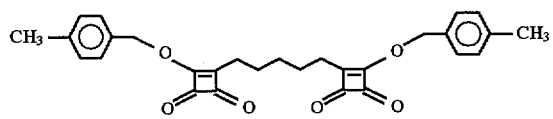

The squaric acid derivatives of Formulae I and II are usually monomeric. However, these derivatives of Formulae I and II can be incorporated into polymers by having at least one of the groups $R^1$, $R^2$ and $R^3$ attached to a polymer. Attachment of the squaric acid derivatives to a polymer in this manner may be advantageous in that it may avoid incompatibility and/or phase separation that might occur between a monomeric squaric acid derivative of Formula I or II and a polymeric binder needed in an imaging medium.

The attachment of the groups $R^1$, $R^2$ and $R^3$ to a polymer may be effected in various ways, which will be familiar to those skilled in the art of polymer synthesis. The squaric acid derivatives may be incorporated into the backbone of a polymer, for example in a polymer similar to the dimer of the formula given above. Alternatively, the squaric acid derivatives may be present as sidechains on a polymer; for example, one of the groups $R^1$, $R^2$ and $R^3$ could contain an amino group able to react with a polymer containing carboxyl groups or derivatives thereof to form an amide linkage which would link the squaric acid derivative as a sidechain on to the polymer, or these groups may contain unsaturated linkages that enable the squaric acid derivatives to be polymerized, either alone or in admixture with other unsaturated monomers.

In the present process, it is generally undesirable to form substantial quantities of gas during the acid-catalyzed decomposition of the secondary acid generator since such gas may distort the imaging medium or form vesicles therein, and such distortion or vesicle formation may interfere with proper image formation. Accordingly, if the decomposition of the squaric acid derivative yields an alkene, it is desirable that the groups $R^1$, $R^3$, $R^4$ and $R^5$ be chosen so that this alkene is a liquid at 20° C., and preferably higher, since some heating of the alkene will inevitably occur during the acid-catalyzed decomposition. Sometimes, however, the alkene liberated may be sufficiently soluble in the medium containing the squaric acid derivative that liberation of a highly volatile alkene will not result in distortion of, or vesicle formation in, the medium.

Another preferred group of secondary acid generators for use in the present process are oxalic acid derivatives that undergo acid-catalyzed breakdown to give oxalic acid or an acidic derivative thereof, for example an oxalic acid hemiester. Although oxalic acid and its acidic derivatives are not quite such strong acids as squaric acid and its acidic derivatives, oxalic acid and its derivatives are sufficiently strong acids for use with most image dyes. Also, oxalic acid derivatives are, in general, less costly than squaric acid derivatives.

The types of oxalic acid derivatives preferred for use in the present process are rather more diverse in structure than the squaric acid derivatives, and the choice of oxalic acid derivative for any specific process may be governed more by the thermal breakdown properties of the derivative than its exact chemical structure; in general, for practical reasons such as the limited temperature range to which other components of the imaging medium may safely be exposed, it is preferred that the oxalic acid derivative be one which begins to decompose thermally at a temperature in the range of about 140° to about 180° C., as measured by differential scanning calorimetry in a nitrogen atmosphere at a 10° C./minute temperature ramp, in the absence of any catalyst. Since the presence of an acid catalyst lowers the thermal decomposition temperature of oxalic acid derivatives by at least about 20° C. and potentially significantly more, derivatives which decompose uncatalyzed at about 140° to about 180° C., will, in the presence of acid, decompose at temperatures as low as about 65° C., temperatures to which other components of the imaging medium can in general be exposed.

The factors affecting the ability of the oxalic acid derivatives to undergo acid-catalyzed thermal decomposition are similar to those affecting the ability of the aforementioned squaric acid derivatives to undergo the same reaction, and thus the preferred ester groups are of the same types. Accordingly, preferred oxalic acid derivatives for use in the present process include:

(a) primary and secondary esters of oxalic acid in which the α-carbon atom (i. e., the carbon atom bonded directly to the —O— atom of the oxalate grouping) bears a non-basic cation-stabilizing group. This cation-stabilizing group may be, for example, an $sp^2$ or sp hybridized carbon atom, or an oxygen atom;

(b) tertiary esters of oxalic acid in which the α-carbon atom does not have an $sp^2$ or sp hybridized carbon atom directly bonded thereto; and (c) tertiary esters of oxalic acid in which the α-carbon atom does have an $sp^2$ or sp hybridized carbon atom directly bonded thereto, provided that this $sp^2$ or sp hybridized carbon atom (or at least one of these $sp^2$ or sp hybridized carbon atoms, if more than one such atom is bonded directly to the α-carbon atom) is conjugated with an electron-withdrawing group.

(d) an ester formed by condensation of two moles of an alcohol with the bis(hemioxalate) of a diol, provided that the ester contains at least one ester grouping of types (a), (b) or (c) above. One example of an ester of this type is that of the structure:

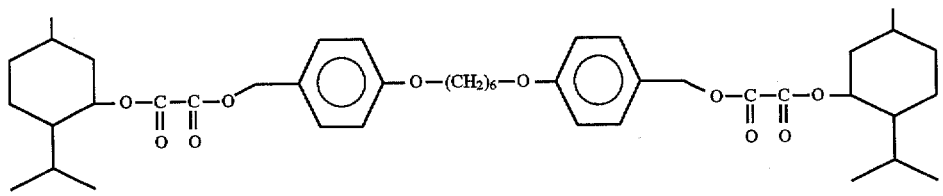

which can be regarded as formed from two moles or menthol (2-methylethyl-4-methylcyclohexane) and one mole of the bis(hemioxalate) or 1,6-bis-(4-hydroxymethylphenoxy) hexane. Since the structure of the central residue of the diol in such esters can vary widely, the solubility and other properties of the esters can be "tuned" as required for compatibility with other components of the imaging medium, while the nature of the end groups, which undergo the acid-forming thermal decomposition, can be varied independently of the nature of the central residue.

(e) polymeric oxalates derived from polymerization or oxalate esters having an ethylenically unsaturated group, provided that the ester contains at least one ester grouping of type (a), (b) or (c) above. As with the squaric acid derivatives discussed above, use of a polymeric oxalate rather than a monomeric one may be advantageous in that it may avoid incompatibility and/or phase separation that might occur between a monomeric derivative and a polymeric binder needed in an imaging medium. Use of a polymeric derivative also tends to inhibit diffusion of the oxalate through the imaging medium during storage before imaging. Although polymeric oxalates can be formed in other ways, at present we prefer to form such oxalates by first forming an oxalate ester in which one of the ester groupings comprises an ethylenically unsaturated group, and then polymerizing this ester using a conventional free radical polymerization initiator, for example azobis(isobutyronitrile) (AIBN). The ethylenically unsaturated group is conveniently an acrylate or methacrylate group, while the other ester grouping in the monomeric oxalate can be any of the types discussed above.

(f) Condensation polymers of oxalates, provided that the ester contains at least one ester grouping of type (a), (b) or (c) above. This type of polymer also possesses the advantages discussed under (e) above.

Methods for the synthesis of the preferred secondary acid generators described above are given in the aforementioned U.S. Pat. No. 5,286,612, application Ser. No. 08/141,852, and International Application No. PCT/US93/10215 (Publication No. WO94/10606.

The image dye used in the present invention may be any material that undergoes a color change in the presence of the second acid. Thus any conventional indicator dye may be used as the acid-sensitive material, as may the leuco dyes disclosed in U.S. Pat. Nos. 4,602,263; 4,720,449 and 4,826,976, which are also sensitive to acid.

Preferred uses of the indicator sensitizing dye form of the present process include:

(a) the use of visible imagewise exposure to produce a visible image, which may be positive or negative;

(b) a true- or false-sensitized full color image exposed at three different wavelengths (for example, a print paper)

(c) the use of near infra-red (700–1200 nm) radiation to produce a visible image having good $D_{min}$ when viewed in reflection (in this process, the protonated from of the sensitizing dye has a near infra-red absorption peak and the unprotonated form of the dye has a substantially lower visible absorption than the protonated form);

(d) the use of ultra-violet exposure to form an ultra-violet photomask; and (e) the formation of a full color image using a single source (preferably a laser) at a single visible or near infra-red wavelength to effect imagewise exposure of all three acid-generating layers of the medium.

Process (e) above uses an imaging medium of the invention having three associated paws of acid generating layers and color-change layers (each pair comprising an acid-generating layer and a color-change layer may hereinafter be called a "bilayer"), with each adjacent pair of bilayers being separated by an acid-impermeable interlayer. This type of imaging medium comprises:

a first acid-generating layer comprising a sensitizing dye in its protonated form, a superacid precursor and a secondary acid generator;

a first color-change layer disposed adjacent the first acid-generating layer and comprising a reactive material, a copper compound and a first image dye undergoing a change in its absorption of radiation upon contact with the second acid generated upon acid-catalyzed decomposition of the secondary acid generator in the first acid-generating layer;

a first acid-resistant interlayer superposed on the first acid-generating layer and the first color-change layer;

a second acid-generating layer disposed on the opposed side of the first acid-resistant interlayer from the first acid-generating layer and the first color-change layer, the second acid-generating layer comprising a sensitizing dye in its unprotonated form, a superacid precursor and a secondary acid generator, the second acid-generating layer further comprising a first auxiliary sensitizer which renders the superacid precursor therein susceptible to decomposition by actinic radiation of a first wavelength in the second wavelength range, but not susceptible to decomposition by actinic radiation of a second wavelength in the second wavelength range;

a second color-change layer disposed adjacent the second acid-generating layer and on the opposed side of the first acid-resistant interlayer from the first acid-generating layer and the first color-change layer, the second color-change layer comprising a reactive material, a copper compound and a second image dye undergoing a change in its absorption of radiation upon contact with the second acid generated upon acid-catalyzed decomposition of the secondary acid generator in the second acid-generating layer, the absorption change undergone by the second image dye being different from that undergone by the first image dye;

a second acid-resistant interlayer disposed on the opposed side of the second acid-generating layer and second color-change layer from the first acid-resistant interlayer;

a third acid-generating layer disposed on the opposed side of the second acid-resistant interlayer from the second acid-generating layer and second color-change layer, the third acid-generating layer comprising a sensitizing dye in its unprotonated form, a superacid precursor and a secondary acid generator, the third acid-generating layer further comprising a second auxiliary sensitizer which renders the superacid precursor therein susceptible to decomposition by actinic radiation of the second wavelength in the second wavelength range, but not susceptible to decomposition by actinic radiation of the first wavelength in the second wavelength range; and a third color-change layer disposed adjacent the third acid-generating layer and on the opposed side of the second acid-resistant interlayer from the second acid-generating layer and the second color-change layer, the third color-change layer comprising a reactive material, a copper compound and a third image dye undergoing a change in its absorption of radiation upon contact with the second acid generated upon acid-catalyzed decomposition of the secondary acid generator in the third acid-generating layer, the absorption change undergone by the third image dye being different from those undergone by the first and second image dyes.

Very conveniently, in this preferred form of imaging medium, the same sensitizing dye, superacid precursor and secondary acid generator are present in each of the three acid-generating layers. The same reactive material and copper compound are also preferably used in each of the three color-forming layers.

This type of imaging medium is imaged in the following manner. First, the medium is imagewise exposed, from the surface closer to the third acid-generating layer to actinic radiation in the first wavelength range, thereby causing, in the exposed areas of the first acid-generating layer or phase, the sensitizing dye to decompose at least part of the superacid precursor, with formation of unbuffered superacid in the first acid-generating layer, without substantial production of unbuffered superacid in the second and third acid-generating layers. Thereafter, the whole imaging medium is exposed to radiation of the first wavelength in the second wavelength range, thus decomposing part of the superacid precursor in the second acid-generating layer to produce superacid and converting at least part of the sensitizing dye in the second acid-generating layer to its protonated form, without substantial production of superacid in the third acid-generating layer. The medium is then imagewise exposed to actinic radiation in the first wavelength range, thus causing, in the exposed areas of the second acid-generating layer or phase, the sensitizing dye to decompose at least part of the superacid precursor, with formation of unbuffered superacid in the second acid-generating layer, without substantial production of unbuffered superacid in the first and third acid-generating layers. Thereafter, the whole imaging medium is exposed to radiation of the second wavelength in the second wavelength range, thus decomposing part of the superacid precursor in the third acid-generating layer to produce superacid and converting at least part of the sensitizing dye in the third acid-generating layer to its protonated form. The medium is then imagewise exposed to actinic radiation in the first wavelength range, thus causing, in the exposed areas of the third acid-generating layer or phase, the sensitizing dye to decompose at least part of the superacid precursor, with formation of unbuffered superacid in the third acid-generating layer, without substantial production of unbuffered superacid in the first and second acid-generating layers. The last two stages of the imaging process are heating the medium to cause, in the exposed areas of the first, second and third acid-generating layers, acid-catalyzed thermal decomposition of the secondary acid generator and formation of the second acid, and admixing the components of the first acid-generating layer with those of the first color-change layer, the components of the second acid-generating layer with those of the second color-change layer, and the components of the third acid-generating layer with those of the third color-change layer, thus causing, in the areas of the medium exposed to the three imagewise exposures, the second acids to bring about the changes in absorption of the first, second and third image dyes and thus form a trichrome image, and the copper compound and reactive material to destroy the remaining superacid precursor in each of the three acid-generating layers, thus fixing the image. If the same sensitizing dye is used in each of the three acid-generating layers, all three imagewise exposures can be effected using radiation of the same wavelength (for example, a single laser) thus avoiding, for example, the need for three separate sources of imaging radiation all of which must be scanned across the imaging medium.

Besides the acid-generating and color-change layers or phases, the imaging media of the present invention may comprise a support and additional layers, for example, a subbing layer to improve adhesion to the support, acid-impermeable interlayers (as discussed above) for separating multiple bilayers from one another, an anti-abrasive topcoat layer, and other auxiliary layers.

The support employed may be transparent or opaque and may be any material that retains its dimensional stability at the temperature used for image formation. Suitable supports include paper, paper coated with a resin or pigment, such as, calcium carbonate or calcined clay, synthetic papers or plastic films, such as polyethylene, polypropylene, polycarbonate, cellulose acetate and polystyrene. The preferred material for the support is a polyester, desirably poly(ethylene terephthalate).

Usually the acid-generating and color-change layers or phases will each also contain a binder; typically these layers are formed by combining the active materials and the binder in a common solvent, applying a layer of the coating composition to the support and then drying. Rather than a solution coating, the layer may be applied as a dispersion or an emulsion. The coating composition also may contain dispersing agents, plasticizers, defoaming agents, coating aids and materials such as waxes to prevent sticking.

The binder used for the acid-generating layer(s) must of course be non-basic, such that the superacid is not buffered by the binder. Examples of binders that may be used include styrene-acrylonitrile copolymers, polystyrene, poly(α-methylstyrene), copolymers of styrene and butadiene, poly(methyl methacrylate), copolymers of methyl and ethyl acrylate, poly(vinyl butyral), polycarbonate, poly(vinylidene chloride) and poly(vinyl chloride). It will be appreciated that the binder selected should not have any adverse effect on the superacid precursor, sensitizer, secondary acid generator, copper compound, reactive material or image dye incorporated therein. Also, the binder should be heat-stable at the temperatures encountered during the heating step and should be transparent so that it does not interfere with viewing of the image. The binder must of course transmit the actinic radiation used in the exposure steps.

Figure 2:
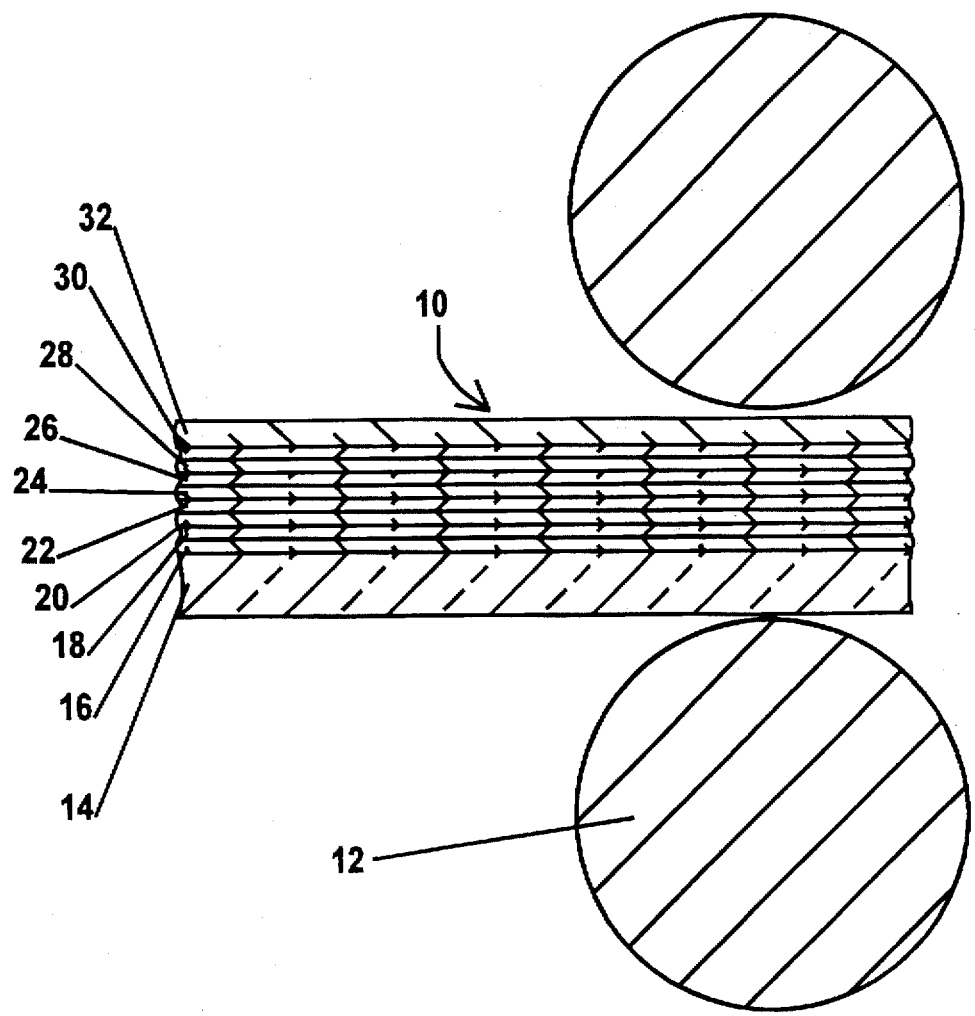
FIG. 2 is a schematic cross-section through an imaging medium of the present invention as it is being passed between a pair of hot rollers during the imaging process of the present invention.

A preferred embodiment of the invention will now be described, though by way of illustration only, with reference to FIG. 2 of the accompanying drawings, which shows a schematic cross-section through a full color imaging medium (generally designated 10) of the invention as the image therein is being fixed by being passed between a pair of hot rollers 12.

The imaging medium 10 comprises a support 14 formed from a plastic film. Typically the support 14 will comprise a polyethylene terephthalate film 3 to 10 mils (76 to 254 mμ) in thickness, and its upper surface (in FIG. 2) may be treated with a sub-coat, such as are well-known to those skilled in the preparation of imaging media, to improve adhesion of the other layers to the support.

On the support 14 is disposed a first acid-generating layer 16 comprising:

(a) a superacid precursor, namely (4-octyloxyphenyl)phenyliodonium hexafluoroantimonate;

(b) an indicator sensitizing dye of the formula:

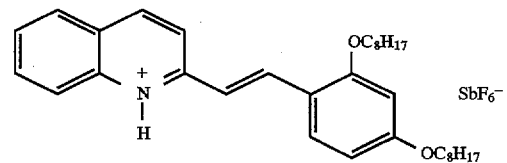

(the unprotonated form is available from Yamada Chemicals, Kyoto, Japan); this sensitizing dye sensitizes the superacid precursor to visible radiation at approximately 450 nm);

(c) a secondary acid generator, which undergoes a superacid-catalyzed thermal decomposition to form a second acid, this secondary acid generator being of the formula:

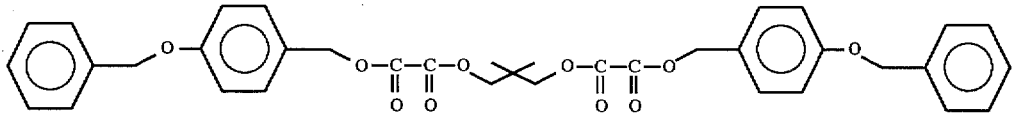

and (d) a polystyrene binder.

On the opposed side of the acid-generating layer 16 from the support 14 is disposed a first color-change layer 18 comprising:

(a) a first image dye, of the formula:

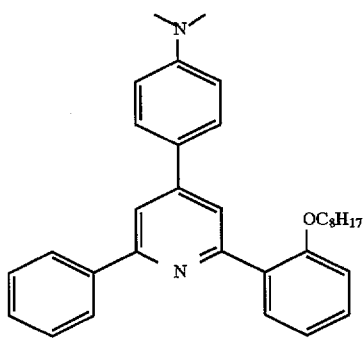

(available from Hilton Davis Co., 2235 Langdon Farm Road, Cincinnati, Ohio 45237 under the tradename "Copikem 37"), which changes from colorless to yellow in the presence of an acid;
(b) copper(II) acetate;
(c) a reactive material, namely potassium acetate; and
(d) a binder comprising Acryloid B82 (available from Rohm & Haas, Philadelphia, Pa. 19104) and poly(vinyl alcohol); the poly(vinyl alcohol) acts as both a binder and a reducing agent for the fixing process.

The acid-generating layer 16 and the color-change layer 18 both contain a binder having a glass transition temperature substantially above room temperature.

Superposed on the first color-change layer 18 is an acid-impermeable layer 20, which serves to prevent acid generated in the second acid-generating layer 22 (see below) during imaging penetrating to the first color-change layer 18. Superposed on the acid-impermeable layer 20 is a second acid-generating layer 22, which contains the same superacid precursor, secondary acid generator and binder as the first acid-generating layer 16. However, the second acid-generating layer 22 contains, in its protonated form, as an indicator sensitizing dye, 2,4,6-tris(2,4-dimethoxyphenyl)-pyridine, which sensitizes the superacid precursor to visible/ near ultra-violet radiation of approximately 400 nm wavelength.

Superposed on the second acid-generating layer 22 is a second color-change layer 24 which is identical to the first color-change layer, except that the Copikem 37 is replaced by a second image dye, of the formula:

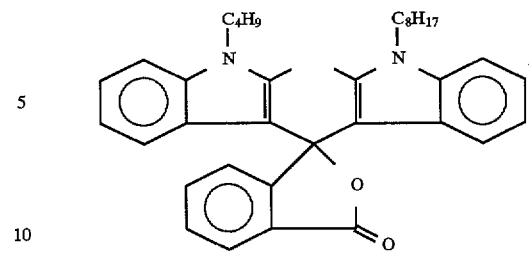

(available from Hilton Davis Co. under the tradename "Copikem 35"), which changes from colorless to magenta in the presence of an acid.

The next layer of the imaging medium is a second acid-impermeable interlayer 26, identical to the layer 20. Superposed on the acid-impermeable layer 26 is a third acid-generating layer 28, which contains the same superacid precursor, secondary acid generator and binder as the first and second acid-generating layers 16 and 22 respectively. However, this third acid-generating layer 28 does not contain an indicator sensitizing dye, but instead contains a conventional non-basic polycyclic aromatic sensitizer, namely 1-vinylpyrene, which sensitizes the superacid precursor to ultra-violet radiation of approximately 350 nm wavelength. Superposed on the third acid-generating layer 28 is a third color-change layer 30 which is identical to the first color-change layer, except that the Copikem 37 is replaced by a third image dye, of the formula:

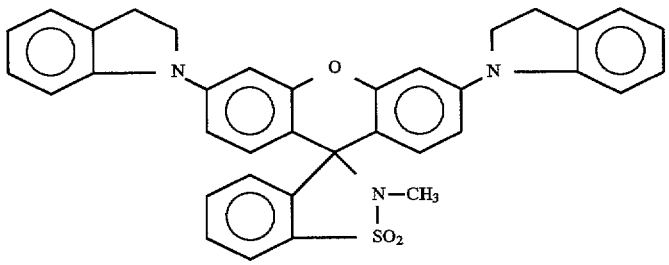

which changes from colorless to cyan in the presence of an acid. Finally, the imaging medium 10 comprises an abrasion-resistant topcoat 32.

The imaging medium 10 is exposed by writing on selected areas of the medium with three radiation sources having wavelengths of 450, 400 and 350 nm respectively. The three radiation sources may be applied simultaneously or sequentially; for example, the medium may be scanned in a raster pattern simultaneously by the focussed beams from three lasers of appropriate wavelengths, or the medium may be exposed sequentially through three masks to radiation from lamps generating radiation of appropriate wavelengths. The 450 nm radiation, which carries the yellow channel of the desired image, images the first acid-generating layer 16, the 400 nm radiation, which carries the magenta channel, images the second acid-generating layer 22 and the 350 nm radiation, which carries the cyan channel, images the third acid-generating layer 28. Thus, as described above with reference to FIGS. 1A–1D, since the sensitizing dyes in the first and second acid-generating layers 16 and 22 respectively are present in protonated form (i.e., these two layers are, prior to imaging, as shown in FIG. 1A, except that all the sensitizing dye, not merely 75%, is present in protonated form), latent images in unbuffered superacid are formed in the first and second acid-generating layers 16 and 22. A latent image in unbuffered superacid is also present in the third acid-generating layer 28, since the vinylpyrene sensitizer used in this layer does not buffer the superacid produced by decomposition of the superacid precursor.

The imaging medium 10 is passed between the heated rollers 12; the heat applied by these rollers causes the unbuffered superacid present in the exposed areas of the acid-generating layers 16, 22 and 28 to cause catalytic breakdown of the secondary acid generator therein, thus causing formation of a quantity of second acid substantially greater than the quantity of unbuffered superacid generated by the imagewise exposures. The heat and pressure applied by the heated rollers 12 also raise the acid-generating layers 16, 22 and 28 and the color-change layers 18, 24 and 30 above their glass transition temperatures, thus causing the components present in each acid-generating layer to intermix with the components present in its associated color-change layer. Accordingly, the three associated pairs of acid-generating and color-change layers are "developed" and fixed as described above with reference to Table 2; i.e., the copper compound decomposes the remaining superacid precursor and the base neutralizes the unbuffered superacid present. In these exposed areas, the second acid produced in the acid-generating layer effects the color change of the image dye in the associated color-change layer, thereby forming yellow, magenta and cyan images in the layers 18, 24 and 30. In the non-exposed areas, excess base remains and the image dye remains uncolored. The acid-impermeable interlayers 20 and 26 prevent the unbuffered superacid or the second acid generated in the second and third acid-generating layers 22 and 28 respectively migrating to the first and second color-change layers 18 and 24 respectively, thus preventing crosstalk among the three images. The mixing of the components present in each bilayer also causes the base present in each of the color-change layers to deprotonate the protonated forms of the sensitizing dye (in the layers using indicator sensitizing dye) present in the non-exposed areas of its associated acid-generating layer, thus removing the visible absorption due to the protonated sensitizing dye, and reducing the $D_{min}$ of the images to a low level.

The following Examples are now given, though by way of illustration only, to show details of preferred reagents, conditions and techniques for use in the process and medium of the present invention.

EXAMPLE 1

This example uses high pressure liquid chromatographic (HPLC) analysis of extracted films to show that complete destruction of an iodonium salt superacid precursor may be achieved, in both exposed and non-exposed areas of an imaging medium of the present invention, by thermal reaction in the presence of a copper reagent. In the absence of the copper reagent, iodonium salt remains undestroyed in both $D_{min}$ and $D_{max}$ areas.

The acid-generating and color-change layers used were coated from organic solvents onto separate pieces of film base. The reactive material used in the color-change layer was a tertiary amine, which acts as both a base and a reducing agent. After exposure and heating of the acid-generating layer, the two film bases were laminated together and heated, thereby mixing the components in the acid-generating layer and the color-change layer.

Three coating fluids were prepared as follows:

Fluid A:

A superacid precursor ((4-octyloxyphenyl)phenyl iodonium hexafluoro-antimonate, 0.25 g), a sensitizer (1-vinylpyrene, 0.1 g), a secondary acid generator (2,2-dimethyl-1-[4-methoxybenzyloxalyloxy]prop-3-yl[4-methoxybenzyl]oxalate, prepared as described in the aforementioned copending application Ser. No. 08/141,852, 4 g) and a polymeric binder (poly(methyl methacrylate), Elvacite 2021, supplied by DuPont de Nemours, Wilmington, Del. 6 g) were dissolved in dichloromethane (114 g). Surfactant FC-431 (available from Minnesota Mining and Manufacturing Corporation, St. Paul, Minn. 1.86 mL of a 2% solution in methyl ethyl ketone (MEK)) was added to the resulting solution.

Fluid B:

A magenta indicator dye (3,3-bis[1-butyl-2-methyl-1H-indol-3-yl]-1-(3H)-isobenzofuranone, available under the tradename Copikem 20 from Hilton Davis Co, 6 g), a hindered amine base (Tinuvin 292, available from Ciba-Geigy Additives Division, Seven Skyline Drive, Hawthorne, N.Y. 10532, 0.75 g), a polymeric binder (the aforementioned Elvacite 2021, 7.5 g) and a surfactant (Aerosol TR-70, supplied by American Cyanamid Co., Wayne, N.J. 07470, with pH adjusted to 6.4 using a 1M aqueous solution of sodium hydroxide, 1.02 g) were dissolved in dichloromethane (159 g, 120 mL).

Fluid C:

Copper(II) acetylacetonate (130 mg), and the same magenta indicator dye (0.4 g), hindered amine base (50 mg), polymeric binder (0.5 g) and surfactant (68 mg) as in Fluid B were dissolved in dichloromethane (10.6 g, 8.0 mL).

EXPERIMENTAL PROCEDURE

Fluid A was coated onto a reflective film base of 6 mil thickness (Melinex film, available from ICI Americas, Inc., Wilmington Del.) using a #12 coating rod, to form Coating A. Fluids B and C were separately coated onto pieces of poly(ethylene terephthalate) base (ICI Type 3295) of 4 mil (101 micron) thickness using a #4 coating rod, to form Coatings B and C, respectively.

The resultant coatings were treated as described below in Experiments A–E:

Experiment A: Exposure and processing to give $D_{max}$, with no fixing reagent in the color-change layer, followed by extraction and HPLC analysis.

A portion of Coating A, 125 cm² in area, was treated as follows:
(i) Exposed to 40 mJ/cm² ultraviolet irradiation using a nuArc 26-1K Mercury Exposure System (available from nuArc Company, Inc, 6200 West Howard Street, Niles Ill. 60648: the output of this device was measured using an IL390A "Light Bug" radiometer, available from International Light, Inc., 17 GrafRoad, Newburyport, Mass. 01950);
(ii) Heated at 120° C. for 30 seconds; and
(iii) Laminated to a 125 cm² piece of Coating B at 120° C., 60 psig and 10 ft/min.
(iv) The laminated structure from (iii) above was heated at 120° C. for 30 seconds;
(v) The laminated structure was next cut into small pieces, placed in a brown glass bottle and extracted with dichloromethane (enough to cover the pieces of film) for 1 hour at room temperature. The film base was removed, and the remaining solution evaporated. The residue was dissolved in acetonitrile (HPLC grade, 3 mL; during this process the polymer precipitated) and the resultant solution was filtered through a 0.45 micron disposable filter; and (vi) Filtered acetonitrile extracts from (v) above were analyzed by HPLC, using a Hewlett-Packard 1090 HPLC instrument equipped with a diode array UV-vis detector, a Rainin RP-18 pre-column and a Keystone Scientific Spherisorb ODS2 column (150×4.6 mm, 5 micron particle size), eluted as follows:

Eluting solvents:
   X. An aqueous solution, 200 mM in hexanesulfonic acid, sodium salt, and 40 mM in triethylamine, adjusted to pH 3.5 with phosphoric acid;
   Y. 1:1 acetonitrile/methanol.

Elution gradient:
   0 min 1:4 X:Y
   5 min 1:8 X:Y
   10 min 100% Y
   Flow rate: 1.2 mL/min
   Detection 254 nm
   Reference: 450 nm
   Injection volume: 25 microliters.

Under these conditions, the retention time of the superacid precursor (4-octyloxyphenyl)phenyl iodonium hexafluoroantimonate was 5.2 minutes. The integration of this peak was recorded. Calibration experiments showed that the area under this peak was proportional to the concentration of (4-octyloxyphenyl)phenyl iodonium hexafluoroantimonate in acetonitrile solution.

Experiment B: Exposure and processing to give $D_{max}$, with copper(II) acetylacetonate fixing reagent in the color-change layer, followed by extraction and HPLC analysis.

Coating A (125 cm$^2$) was treated as in Experiment A above, except that film C (125 cm$^2$) was used instead of film B in step (iii).

Experiment C: Processing without exposure, to give $D_{min}$, with no fixing reagent in the color-change layer, followed by extraction and HPLC analysis.

Coating A (125 cm$^2$) was treated as in Experiment A above, omitting step (i).

Experiment D: Processing without exposure, to give $D_{min}$, with copper(II) acetylacetonate fixing reagent in the color-change layer, followed by extraction and HPLC analysis.

Coating A (125 cm$^2$) was treated as in Experiment A above, omitting step (i), and using film C (125 cm$^2$) instead of film B in step (iii).

Experiment E: Extraction and HPLC analysis of the color-change layer without exposure or processing.

Coating A (125 cm$^2$) was analyzed by the process of steps (v) and (vi) in Experiment A above.

The results from these experiments are shown in Table 3 below.

TABLE 3

| Experiment | A $D_{max}$ no Cu | B $D_{max}$ +Cu | C $D_{min}$ no Cu | D $D_{min}$ no Cu | E No exposure |
|---|---|---|---|---|---|
| Area of HPLC peak at 5.2 minutes retention time (arbitrary units) | 2388 | 0 | 4839 | 0 | 4833 |
| Remaining iodonium salt (%) | 49 | 0 | 100 | 0 | 100 |

These experiments clearly show that, in the presence of the copper(II) fixing reagent, all the iodonium salt is destroyed the $D_{min}$ and $D_{max}$ areas under the imaging conditions described above, whereas without the copper reagent, iodonium salt remains in both $D_{min}$ and $D_{max}$ areas.

EXAMPLE 2

This example shows that the $D_{min}$ of a single-sheet imaging medium can be rendered light-stable by incorporation of a copper reagent into the color-change layer. It is also shown that an initially lower $D_{min}$, and higher image contrast, may be obtained by use of a primary amine rather than a tertiary amine.

Four dispersions were prepared as follows:

Dispersion A

A magenta indicator dye (3-[1-butyl-2-methylindol-3-yl]-3-[1-octyl-2-methylindol-3-yl]-1-(3H)-isobenzofuranone, available under the tradename Copikem 35, from Hilton Davis Co., 2 g), a hindered amine base (Tinuvin 292, 0.5 g), an acrylate polymeric binder (Elvacite 2043, supplied by Du Pont de Nemours, Wilmington, Del., 2.5 g) and a surfactant (Aerosol TR-70 with pH as in Example 1, 0.34 g) were dissolved in dichloromethane (40 mL). De-ionized water (40 g) was added, and the mixture was sonicated. The mixture became initially very viscous; sonication was continued, with addition of additional water (ca. 8 mL), until a marked reduction in viscosity was observed. Finally, evaporation of dichloromethane afforded Dispersion A (10.0% solid materials in water).

Dispersion B

A primary amine base (2-aminoethylimidazolidone, 0.25 g), and the same magenta indicator dye (1.0 g), binder (1.25 g) and surfactant (0.17 g) as in Dispersion A were dissolved in dichloromethane (20 mL). De-ionized water (20 g) was added, and the mixture was sonicated. The mixture became initially very viscous; sonication was continued, with addition of additional water (ca. 4 mL), until a marked reduction in viscosity was observed. Finally, evaporation of dichloromethane afforded Dispersion B (10.2% solid materials in water).

Dispersion C

Copper(II) ethylacetoacetate (90 mg), and the same binder (1.5 g) and surfactant (0.204 g) as in Dispersion A were dissolved in dichloromethane (25 mL). De-ionized water (24 g) was added, and the mixture was sonicated. The mixture became initially very viscous; sonication was continued until a marked reduction in viscosity was observed. Finally, evaporation of dichloromethane afforded Dispersion C (8.05% solid materials in water).

Dispersion D

A polyacrylate binder (Elvacite 2043, 45.0 g) and a surfactant (TR-70, with pH as in Example 1, 3.0 g) were dissolved in dichloromethane (307 g.). De-ionized water (280 g) was added, and the mixture was homogenized. Evaporation of dichloromethane gave Dispersion D (13.8% solid materials in water).

Five coating fluids were also prepared as follows:

Fluid A

A superacid precursor ((4-octyloxyphenyl)phenyl iodonium hexafluoroantimonate, 50 mg, a sensitizer (1-vinylpyrene, 40 mg), a secondary acid generator (2,2-dimethyl-1-[4-benzyloxybenzyloxalyloxy]prop-3-yl[4-benzyloxybenzyl-benzyl]oxalate (prepared as described in the aforementioned copending application Ser. No. 08/141, 852, 200 mg), a polystyrene binder (average molecular weight 45,000, available from Aldrich Chemical Co., Milwaukee, Wis., 400 mg) and a surfactant (FC-431, (available from Minnesota Mining and Manufacturing Corporation, St. Paul, Minn., 10 mg of a 2% solution in MEK) were dissolved, with warming, in sufficient 2-butanone to bring the total weight of the solution to 7.0 g.

Fluid B1

Dispersion A (1.0 g) was combined with 2.0 g of dispersion D, 0.38 g of a 9.9% aqueous solution of poly(vinyl alcohol) (Vinol 540, available from Air Products Corporation, Allentown, Pa.) and a surfactant (FC-120, available from Minnesota Mining and Manufacturing Corporation, St. Paul, Minn., 0.03 mL of a 10% solution in 2-butanone).

Fluid B2

Dispersion A (1.0 g) was combined with 2.0 g of dispersion C, and the same amounts of Vinol 540 and FC-120 as in Fluid B1.

Fluid B3

Dispersion B (1.0 g) was combined with 2.0 g of dispersion D, and the same amounts of Vinol 540 and FC-120 as in Fluid B1.

Fluid B4

Dispersion B (1.0 g) was combined with 2.0 g of dispersion C, and the same amounts of Vinol 540 and FC-120 as in Fluid B1.

EXPERIMENTAL PROCEDURE

An acid-generating layer was formed by coating Fluid A (pre-heated to about 50° C.) onto reflective Melinex base of 6 mil thickness with a #5 coating rod.

Four different color-change layers were coated on to separate pieces of this film by coating Fluids B1, B2, B3 and B4, using a #8 coating rod.

The resultant structures, A/B1, A/B2, A/B3 and A/B4 respectively, had the estimated coverages (in micrograms/cm$^2$) shown in Table 4:

TABLE 4

| Structure | A/B1 | A/B2 | A/B3 | A/B4 |
|---|---|---|---|---|
| Iodonium salt | 10.9 | 10.9 | 10.9 | 109 |
| Secondary acid generator | 44.0 | 44.0 | 44.0 | 44.0 |
| Sensitizer | 8.8 | 8.8 | 8.8 | 8.8 |
| Image dye | 21.8 | 21.8 | 21.8 | 21.8 |
| Primary Amine | 0 | 0 | 5.5 | 5.5 |
| Tertiary Amine | 5.5 | 5.5 | 0 | 0 |
| Copper salt | 0 | 4.7 | 0 | 4.7 |

Portions of these four structures were exposed to ultraviolet radiation in the same way as in Example 1 but at an exposure of 21 mJ/cm$^2$, with other portions remaining unexposed. The structures were then heated, first at 65° C. for 20 seconds, and finally at 120° C. for 30 seconds. Optical densities (green) were then recorded in $D_{max}$ (exposed) and $D_{min}$ (non-exposed) areas using an X-Rite 310 photographic densitometer, supplied by X-Rite Inc., Grandville, Mich., with the appropriate filter (Status A).

Portions of the $D_{min}$ and $D_{max}$ areas of the imaged structures were then mounted in slide mounts and exposed to intense light in the gate of an Ektagraphic III slide projector (available from Eastman Kodak) equipped with a 300 W Sylvania tungsten halogen lamp (available from GTE Products Corporation, Winchester, Ky.) for 1 minute. The coated side of the film base was arranged to face the projector lamp. After this exposure, optical densities (green) were again measured in $D_{min}$ and $D_{max}$ areas.

Results from these experiments are shown in Table 5 below, in which "PA" denotes the primary amine and "TA" denotes tertiary amine, and "exposure" refers to exposure in the projector.

TABLE 5

| Structure | A/B1 No Cu/TA | A/B2 Cu/TA | A/B3 No Cu/PA | A/B4 Cu/PA |
|---|---|---|---|---|
| $D_{min}$ before exposure | 0.11 | 0.36 | 0.11 | 0.12 |
| $D_{min}$ after exposure | 0.36 | 0.35 | 0.51 | 0.17 |
| $D_{min}$ change during exposure | 0.25 | −0.01 | 0.40 | 0.05 |
| $D_{max}$ before exposure | 0.95 | 1.17 | 0.93 | 1.09 |
| $D_{max}$ after exposure | 0.99 | 1.07 | 0.97 | 1.03 |
| $D_{max}$ change during exposure | 0.04 | −0.1 | 0.04 | −0.06 |

In structures A/B1 and A/B3, in which the copper reagent was not present, $D_{min}$ rose substantially during light exposure. In structures A/B2 and A/B4, in each of which the copper reagent was present, the rise in $D_{min}$ was much reduced or eliminated. In structure A/B4, in which a primary amine was used as the basic component, initial $D_{min}$ was much lower, and contrast was higher than in structure A/B2, in which a tertiary amine was used.

$D_{max}$ was not affected as substantially as $D_{min}$. However, $D_{max}$ rose slightly in structures A/B1 and A/B3, without the copper reagent, but fell slightly in structures A/B2 and A/B4, which incorporated the copper reagent. (The fall in $D_{max}$ is probably due to photolytic instability of the image dye itself in the presence of the other permanent components of the imaging system.)

EXAMPLE 3

This example illustrates the use of a copper salt and potassium acetate base to produce a fixed image having excellent contrast. Two coating fluids were prepared as follows:

Fluid A

The same superacid precursor (20 mg) and secondary acid generator (80 mg) as in Example 1, the same polystyrene binder (800 mg of a 20% solution in 2-butanone) as in Example 2, Fluid A, and a sensitizer (9,10-diphenylanthracene, 16 mg), were combined (heating to about 50° C. was required).

Fluid B

The same Copikem 35 magenta indicator dye as in Example 2, Dispersion A (10.0 g) was added to a solution of an acrylate polymeric binder (Acryloid B-82, supplied by Rohm & Haas Corporation, Philadelphia, Pa. 19104, 12.5 g) dissolved in ethyl acetate (77.5 g), and the resultant solution was added to 31.8 g of a 9.81% aqueous solution of the same Vinol 540 poly(vinyl alcohol) as used in Example 2, Fluids B1–B4, to which 73 g of water had been added. The resultant mixture was sonicated, after which evaporation of ethyl acetate afforded the required dispersion (which was diluted with water to 17.0% solids by weight).

To 0.5 g of this dispersion was added 50 mg of a 20% aqueous solution of potassium acetate, 200 mg of an aqueous solution which was 0.71% in copper(II) acetate and 0.62% in poly(vinyl alcohol) (Vinol 540), and 10 mg of a 5% solution of a surfactant (Igepal CO-630, available from GAF Corporation, 1361 Alps Road, Wayne N.J. 07470).

An imaging medium was prepared by first coating Fluid A (pre-heated to about 50° C.) on to reflective Melinex base of 4 mil (101 µm) thickness using a #4 coating rod, then coating Fluid B on to this dried layer, using a #3 coating rod. This imaging medium was exposed, at the exposures shown in Table 6 below, to ultraviolet radiation using the same apparatus as in Example 1 and a neutral density filter. After exposure, the medium was heated first at 45° C. for 20 seconds, then at 120° C. for 1 minute, and the green optical densities were recorded using an X-Rite 310 photographic densitometer, supplied by X-Rite inc., Grandville, Mich., with the appropriate filter (Status A).

Finally, the exposed and processed imaging medium was tested for light stability by exposure to fluorescent lamp illumination (2000 ft candles) for the periods of time shown in Table 6, following which the green optical densities were again read. The results obtained are shown in Table 6 below, in which "OD" denotes optical density.

TABLE 6

| Exposure (mJ/cm$^2$) | 50.5 | 27.8 | 14.4 | 7.0 | 4.3 | 1.8 | 0 |
| --- | --- | --- | --- | --- | --- | --- | --- |
| Initial OD | 1.94 | 1.97 | 1.84 | 1.83 | 1.81 | 0.33 | 0.08 |
| OD after 40 min. fluorescent exposure | 1.98 | 1.99 | 1.87 | 1.89 | 1.80 | 0.65 | 0.09 |
| OD after 16.5 hour fluorescent exposure | 1.84 | 1.89 | 1.80 | 1.81 | 1.76 | 0.87 | 0.11 |

From Table 6, it will be seen that, except for the step having density intermediate between $D_{min}$ and $D_{max}$ obtained upon 1.8 mJ/cm$^2$ irradiation, fixation of the image was achieved. Since this medium was designed to be essentially binary, the lack of stability of intermediate densities was not important.

From the foregoing, it will be seen that the present invention provides an imaging medium, and a process for producing and fixing an image, which produces a final image which is essentially insensitive to radiation of the wavelengths used to produce the image, and which should thus have improved long term storage stability. The copper and reactive material needed for fixing can be chosen so that they can readily be incorporated into the coating solution or dispersion used to form the color-change layer of the imaging medium; thus, the provision of the fixing agent does not require major changes in the manner in which the medium is produced, or the formation of additional layers in the imaging medium.

We claim:

1. A process for producing and fixing ant image, which process comprises:
    providing an imaging medium comprising an acid-generating layer or phase comprising a mixture of a superacid precursor, a sensitizer and a secondary acid generator, and a color-change layer or phase comprising an image dye;
        the sensitizer being capable of absorbing actinic radiation of a sensitizer wavelength which does not, in the absence of the sensitizer, cause decomposition of the superacid precursor to form a first acid;
        the secondary acid generator being capable of acid-catalyzed thermal decomposition by the first acid acid to form a second acid; and
        the image dye undergoing a change in its absorption of radiation upon contact with the second acid;
    imagewise exposing the medium to actinic radiation of the sensitizer wavelength, thereby causing, in the exposed areas of the acid-generating layer or phase, the sensitizer to decompose at least part of the superacid precursor, the imagewise exposure leading to imagewise formation of the first acid in the acid-generating layer;
    thereafter, heating the medium to cause, in the exposed areas of the acid-generating layer or phase, acid-catalyzed thermal decomposition of the secondary acid generator and formation of the second acid;
    admixing the components of the acid-generating and color-change layers or phases, thereby causing, in the exposed areas of the medium, the second acid to bring about the change in absorption of the image dye and thereby form the image;
    in at least the non-exposed areas of the medium reacting, with the superacid precursor, a copper compound and a reactive material more reactive than the image dye to the products resulting from decomposition of the superacid precursor in the presence of the copper compound, thereby causing the copper compound and the reactive material to bring about decomposition of the superacid precursor remaining in the non-exposed areas, and thereby fix the image.

2. A process according to claim 1 wherein the copper compound is a copper(II) salt and a reducing agent is present in the medium.

3. A process according to claim 2 wherein the copper(II) salt is any one or more of copper(II) acetate, copper(II) ethylacetoacetate, copper(II) acetylacetonate and copper(II) trifluoroacetylacetonate.

4. A process according to claim 2 wherein the reducing agent is a secondary alcohol.

5. A process according to claim 2 wherein the reducing agent has the form of a polymeric binder in at least one of the acid-generating and color-change layers.

6. A process according to claim 1 wherein the copper compound is copper(I) acetate.

7. A process according to claim 1 wherein the reactive material is a carboxylate.

8. A process according to claim 1 wherein the reactive material is a nucleophilic amine.

9. A process according to claim 1 wherein, prior to the imagewise exposure, the copper compound is present in the color-change layer or phase.

10. A process according to claim 1 wherein the imagewise exposure causes formation of a protonated product derived from the sensitizer, and the imagewise exposure is followed by a blanket exposure of the imagin of a wavelength different from the sensitizer wavelength, this blanket exposure causing decomposition of additional superacid precursor and the formation of unbuffered superacid in areas exposed during the imagewise exposure, but not causing formation of unbuffered superacid in areas not exposed during the imagewise exposure.

11. A process according to claim 1 wherein the sensitizer has a unprotonated form and a protonated form, the protonated form having substantially greater substantial absorption at the sensitizer wavelength than the unprotonated form, and the imagewise exposure is effected while at least part of the sensitizer is in its protonated form.

12. A process according to claim 11 wherein, after the imagewise exposure, the whole imaging medium is exposed to radiation of a wavelength different from the sensitizer wavelength, whereby part of the superacid precursor is decomposed to produce superacid and, in exposed areas, the sensitizer becomes doubly protonated, and unbuffered superacid is produced, whereas in non-exposed areas no unbuffered superacid is produced.

13. A process according to claim 1 which is carried out in an essentially anhydrous medium.

14. A process according to claim 1 wherein the acid-generating and color-change layers or phases each comprise a polymeric binder.

15. A process according to claim 1 wherein the superacid precursor comprises an iodonium compound.

16. A process according to claim 15 wherein the iodonium compound comprises a diphenyliodonium compound.

17. A process according to claim 1 wherein the secondary acid generator is an oxalate or a 3,4-disubstituted-cyclobut-3-ene-1,2-dione in which at least one of the 3- and 4-substituents consists of an oxygen atom bonded to the cyclobut-3-ene-1,2-dione ring, and an alkyl or alkylene group, a partially hydrogenated aryl or arylene group, or an aralkyl group bonded to said oxygen atom, said 3,4-disubstituted-cyclobut-3-ene-1,2-dione being capable of decomposing so as to cause replacement of the or each original alkoxy, alkyleneoxy, aryloxy, aryleneoxy or aralkyloxy group of the 3,4-disubstituted-cyclobut-3-ene-1,2-dione with a hydroxyl group, thereby producing squaric acid or an acidic squaric acid derivative having one hydroxyl group.

18. An imaging medium comprising an acid-generating layer or phase comprising a mixture of a superacid precursor, a sensitizer and a secondary acid generator, and a color-change layer or phase comprising an image dye;

the sensitizer being capable of absorbing actinic radiation of a sensitizer wavelength which does not, in the absence of the sensitizer, cause decomposition of the superacid precursor to form a first acid;

the secondary acid generator being capable of acid-catalyzed thermal decomposition by the first acid acid to form a second acid; and the image dye undergoing a change in its absorption of radiation upon contact with the second acid;

the imaging medium further comprising a copper compound and a reactive material more reactive than the image dye to the products resulting from decomposition of the superacid precursor in the presence of the copper compound, the copper compound and the reactive material being capable of bringing about the decomposition of the superacid precursor.

19. An imaging medium according to claim 18 wherein the copper compound is a copper(II) salt and a reducing agent is present in the medium.

20. An imaging medium according to claim 19 wherein the copper(II) salt is any one or more of copper(II) acetate, copper(II) ethylacetoacetate, copper(II) acetylacetonate and copper(II) trifluoroacetylacetonate.

21. An imaging medium according to claim 19 wherein the reducing agent is a secondary alcohol.

22. An imaging medium according to claim 19 wherein the reducing agent has the form of a polymeric binder in at least one of the acid-generating and color-change layers.

23. An imaging medium according to claim 18 wherein the copper compound is copper(I) acetate.

24. An imaging medium according to claim 18 wherein the reactive material is a carboxylate.

25. An imaging medium according to claim 18 wherein the reactive material is a nucleophilic amine.

26. An imaging medium according to claim 18 wherein the sensitizer has a unprotonated form and a protonated form, the protonated form having substantially greater substantial absorption at the sensitizer wavelength than the unprotonated form.

27. An imaging medium according to claim 18 which is essentially anhydrous.

28. An imaging medium according to claim 18 wherein the acid-generating and color-change layers or phases each comprise a polymeric binder.

29. An imaging medium according to claim 18 wherein the superacid precursor comprises an iodonium compound.

30. An imaging medium according to claim 29 wherein the iodonium compound comprises a diphenyliodonium compound.

31. An imaging medium according to claim 18 wherein the secondary acid generator comprises an oxalate or a 3,4-disubstituted-cyclobut-3-ene-1,2-dione in which at least one of the 3- and 4-substituents consists of an oxygen atom bonded to the cyclobut-3-ene-1,2-dione ring, and an alkyl or alkylene group, a partially hydrogenated aryl or arylene group, or an aralkyl group bonded to said oxygen atom, said 3,4-disubstituted-cyclobut-3-ene-1,2-dione being capable of decomposing so as to cause replacement of the or each original alkoxy, alkyleneoxy, aryloxy, aryleneoxy or aralkyloxy group of the 3,4-disubstituted-cyclobut-3-ene-1,2-dione with a hydroxyl group, thereby producing squaric acid or an acidic squaric acid derivative having one hydroxyl group.

32. An imaging medium according to claim 31 wherein the 3,4-disubstituted-cyclobut-3-ene-1,2-dione is selected from the group consisting of:

(a) primary and secondary esters of squaric acid in which the α-carbon atom bears a non-basic cation-stabilizing group;

(b) tertiary esters of squaric acid in which the α-carbon atom does not have an $sp^2$ or sp hybridized carbon atom directly bonded thereto; and (c) tertiary esters of squaric acid in which the α-carbon atom does have an $sp^2$ or sp hybridized carbon atom directly bonded thereto, provided that this $sp^2$ or sp hybridized carbon atom, or at least one of these $sp^2$ or sp hybridized carbon atoms, if more than one such atom is bonded directly to the α-carbon atom, is conjugated with an electron-withdrawing group.

33. An imaging medium according to claim 32 wherein the 3,4-disubstituted-cyclobut-3-ene-1,2-dione is of one of the following formulae:

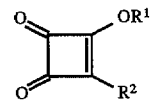
a.

in which $R^1$ is an alkyl group, a partially hydrogenated aromatic group, or an aralkyl group, and $R^2$ is a hydrogen atom or an alkyl, cycloalkyl, aralkyl, aryl, amino, acylamino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer;

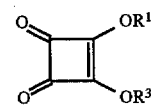
b.

in which $R^1$ and $R^3$ independently are each an alkyl group, a partially hydrogenated aryl group or an aralkyl group, subject to the proviso that either or both of the groups $R^1$ and $R^3$ may be attached to a polymer; and

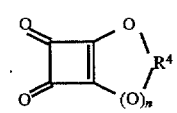
c.

in which n is 0 or 1, and $R^4$ is an alkylene group or a partially hydrogenated arylene group;

or the squaric acid derivative comprises at least one unit of the formula:

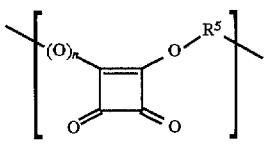

in which n is 0 or 1, and $R^5$ is an alkylene or partially hydrogenated arylene group.

34. An imaging medium according to claim 31 wherein the oxalate is selected from the group consisting of:

(a) primary and secondary esters of oxalic acid in which the α-carbon atom bears a non-basic cation-stabilizing group;

(b) tertiary esters of oxalic add in which the α-carbon atom does not have an $sp^2$ or sp hybridized carbon atom directly bonded thereto;

(c) tertiary esters of oxalic acid in which the α-carbon atom does have an $sp^2$ or sp hybridized carbon atom directly bonded thereto, provided that this $sp^2$ or sp hybridized carbon atom, or at least one of these $sp^2$ or sp hybridized carbon atoms, if more than one such atom is bonded directly to the α-carbon atom, is conjugated with an electron-withdrawing group;

(d) an ester formed by condensation of two moles of an alcohol with the bis(hemioxalate) of a diol, provided that the ester contains at least one ester grouping of type (a), (b) or (c);

(e) polymeric oxalates derived from polymerization of oxalate esters having an ethylenically unsaturated group, provided that the ester contains at least one ester grouping of type (a), (b) or (c); and (f) condensation polymers of oxalates, provided that the ester contains at least one ester grouping of type (a), (b) or (c) above.

35. A process for fixing an image in an imaging medium, the imaging medium having exposed areas comprising an image dye at least part of which is in protonated form, an acid, and a sensitizer, and non-exposed areas comprising the image dye in unprotonated form, the sensitizer, a superacid precursor and a secondary acid generator, the sensitizer being capable of absorbing actinic radiation of a sensitizer wavelength which does not, in the absence of the sensitizer, cause decomposition of the superacid precursor to form a first acid, and the secondary acid generator being capable of acid-catalyzed thermal decomposition by the first acid to form a second acid, the process comprising reacting, with the superacid precursor, in at least the non-exposed areas of the medium, a copper compound and a reactive material more reactive than the image dye to the products resulting from decomposition of the superacid precursor in the presence of the copper compound, thereby causing the copper compound and the reactive material to bring about decomposition of the superacid precursor in the non-exposed areas, and thereby fixing the image.

* * * * *